United States Patent
Tatsuno et al.

(10) Patent No.: US 7,164,865 B2
(45) Date of Patent: Jan. 16, 2007

(54) OPTICAL FIBER COMMUNICATION EQUIPMENT AND ITS APPLIED OPTICAL SYSTEMS

(75) Inventors: Kimio Tatsuno, Tokyo (JP); Tatemi Ido, Kodaira (JP); Yasunori Iwafuji, Yokohama (JP); Hideyuki Kuwano, Yokohama (JP); Naohiko Baba, Fujisawa (JP)

(73) Assignee: Opnext Japan, Inc., Yokohama (JP)

( * ) Notice: Subject to any disclaimer, the term of this patent is extended or adjusted under 35 U.S.C. 154(b) by 677 days.

(21) Appl. No.: 09/814,693

(22) Filed: Mar. 15, 2001

(65) Prior Publication Data

US 2002/0051270 A1    May 2, 2002

(30) Foreign Application Priority Data

Mar. 31, 2000    (JP)    ............................. 2000-101239

(51) Int. Cl.
  H04B 10/04    (2006.01)
  H04B 10/12    (2006.01)
  H04J 14/02    (2006.01)
  H01S 3/10    (2006.01)
  H01S 3/13    (2006.01)

(52) U.S. Cl. .................... 398/201; 398/182; 398/95; 398/196; 372/20; 372/32; 372/34

(58) Field of Classification Search ............... 398/29, 398/32, 33, 95, 196, 182, 200, 201; 372/20, 372/23, 29.011, 29.022, 32, 34
See application file for complete search history.

(56) References Cited

U.S. PATENT DOCUMENTS

| | | | |
|---|---|---|---|
| 4,583,228 A | 4/1986 | Brown et al. ................. 372/32 |
| 4,790,634 A * | 12/1988 | Miller et al. ................ 349/198 |
| 4,821,273 A * | 4/1989 | Hori ............................ 372/31 |
| 5,185,643 A | 2/1993 | Vry et al. .................... 356/358 |
| 5,286,966 A | 2/1994 | Matsuura et al. ........... 250/205 |
| 6,122,301 A * | 9/2000 | Tei et al. ...................... 372/32 |
| 6,144,025 A * | 11/2000 | Tei et al. .................... 250/226 |
| 6,233,263 B1* | 5/2001 | Chang-Hasnain et al. .... 372/32 |
| 6,353,623 B1* | 3/2002 | Munks et al. ................ 372/20 |
| 6,483,956 B1* | 11/2002 | Shevy et al. ................. 385/11 |
| 6,501,773 B1* | 12/2002 | Volz et al. ............... 372/29.02 |
| 6,526,079 B1* | 2/2003 | Watterson et al. ............ 372/32 |
| 6,587,214 B1* | 7/2003 | Munks ....................... 356/519 |
| 6,631,019 B1* | 10/2003 | Vujkovic-Cvijin et al. . 398/197 |
| 2004/0091002 A1* | 5/2004 | Watterson et al. ............ 372/20 |

FOREIGN PATENT DOCUMENTS

| | | |
|---|---|---|
| EP | 0867989 | 9/1999 |
| JP | 10-079723 | 3/1998 |
| JP | 11-031859 | 2/1999 |
| WO | WO95/29521 | 11/1995 |

OTHER PUBLICATIONS

European Search Report based European Serial No. 01106351, dated Apr. 16, 2004.

* cited by examiner

*Primary Examiner*—Jason Chan
*Assistant Examiner*—Nathan Curs
(74) *Attorney, Agent, or Firm*—Mattingly, Stanger, Malur & Brundidge, P.C.

(57) ABSTRACT

An object of disclosed technology is to control lasing wavelengths so that a wavelength shift does not occurs. Another object is to permit wavelengths of a light source for wavelength division multiplexing optical-fiber communication system to be variable in response to an ITU-TS grid. A means for achieving the objects is as follows: locating an etalon in a light path of diode laser light, which is a parallel plane wave changed by a collimator lens; generating a wavelength error signal from a difference between both of divided pieces of light from transmitted light or reflected light; and locking a wavelength of a diode laser device according to the wavelength error signal.

21 Claims, 20 Drawing Sheets

ETALON TRANSPARENT LIGHT

PHASE DIFFERENCE
$=2\pi(nt/\lambda)\cos(\theta/n)$

OPTICAL FIBER COMMUNICATION EQUIPMENT AND ITS APPLIED OPTICAL SYSTEMS

BACKGROUND OF THE INVENTION

The present invention relates to an optical-fiber communication module, and more specifically, to an optical-fiber communication module that is applied to a Wavelength Division Multiplexing optical-fiber communication system. Furthermore, the present invention relates to applied equipment that uses such optical-fiber communication module.

Because optical-fiber communication provides us with high resistance to electromagnetic noise as well as long-distance, high-speed, and high-capacity communication, the optical-fiber communication enables us to construct a communication system that ensures high reliability. Conventionally, this system transmits light having one wavelength through one optical fiber. However, with the coming of high-capacity information-oriented society in recent years, higher transmission capacity is required. For this reason, technology of Wavelength Division Multiplexing optical-fiber communication system has been put into practical use. According to the technology, a plurality of light having a different wavelength one another are transmitted through one optical fiber, which permits a number of communication channels to be increased for higher capacity. For wavelengths of light transmitted through an optical fiber, a wavelength region having a low transmission loss for the optical fiber is used. A 1.3 µ-region and a 1.5 µ-region are called 'transmission window'. Because wavelength widths of those windows are limited, narrowing a wavelength interval between channels increases a number of transmission channels. For the present, although a frequency interval is 200 GHz or 100 GHz, the interval tends to become narrower (50 GHz or 25 GHz). If they are expressed in wavelength intervals, they are about 1.6 nm, 0.8 nm, 0.4 nm, and 0.2 nm respectively. If the wavelength interval is narrowed in this manner, it becomes necessary to keep wavelengths of a laser light source constant with accuracy. That is because if one of the wavelengths of the laser light source fluctuates and overlaps with a wavelength of the next channel, a crosstalk with the next wavelength channel arises at a receiving end, which impairs reliable information communication. Those wavelength channels (or frequencies) are called ITU-TS (International Telecommunication Union-Telecommunication Standardization Sector) grid, which is widely known as ITU recommendation. Additionally, wavelength fluctuations of the laser light source due to aging must also be prevented.

Taking such background into consideration, a method for controlling wavelengths of a laser light source used for Wavelength Division Multiplexing optical-fiber communication has been proposed. As an example of this method, there is a method called 'wavelength locking' described in Japanese Patent Application Laid-Open No. Hei 11-31859. A basic configuration of this example is shown in FIG. 1. Light emitted from a diode laser 1 is introduced into a fiber 2, and then condensed by a lens 3. The condensed laser light reaches a beam splitter 5 through a first bandpass filter 4. This laser light is reflected by this beam splitter 5, and reaches a bandpass filter 8 that uses a wavelength filter, in other words, a thin film device of dielectric. After that, a light detector PD1 receives transmitted light that has been transmitted through a shoulder slope portion in transmission characteristics of the bandpass filter. On the other hand, a light detector PD2 receives reflected light of the bandpass filter 8. In this example, a photocurrent difference signal between the light detector PD1 and the light detector PD2 is treated as a signal for detecting a wavelength shift. By the way, a reference number 7 is an optical fiber; a reference number 9 is an output-ratio calculating means; and a reference number 10 is a wavelength controlling means.

This example uses a bandpass filter having a single transmission peak. However, only one kind of bandpass filter cannot handle a different wavelength channel. For this reason, in order to handle the ITU-TS grid wavelength channel described above, as many bandpass filters having a different bandpass as a number of channels are required. Producing those many filters results in complicated production control, which is not realistic.

In addition, as clearly shown in FIG. 1, this example has the following mechanism: preparing a wavelength locker module separately from the optical-fiber transmitter module comprising the laser light source; branching a portion of light of the optical-fiber transmitter module and introducing it into the wavelength locker module to detect a wavelength shift; and giving its feedback to the laser light source in the optical-fiber communication module.

In this case, integrating the wavelength locker module into the laser light source module and building the wavelength locker module into the laser light source module enables us to achieve higher cost performance. In addition, regarding to the laser light source module, concurrently preparing monitoring-light for keeping a fiber output constant is required.

Moreover, an example showing that a wavelength-locking portion is built into a laser module is described in Japanese Patent Application Laid-Open No. Hei 10-79723. Additionally, as shown in FIG. 2, because an etalon 18 is used as a wavelength filter, a transmission peak appears repeatedly in response to an order of multiple interference. Because of it, one wavelength filter permits a plurality of wavelength channels to be wavelength-locked. To be more specific, a parallel plane plate (etalon) 18 is located at a tilt in a divergent light path from a laser light source 12. Twin light detectors 20 and 22, which are placed immediately behind the parallel plane plate, split and receive transmitted light. A photocurrent difference between them is a wavelength-shift detecting signal 28. By the way, in the diagram, a reference number 16 is an optical lens; a reference number 12 is a laser emitting source; and a reference number 14 is a diode laser edge. In this case, each of the light that reaches the twin light detectors 20 and 22 must have a different light path length each other when passing through an etalon. In other words, the etalon requires incidence of divergent light or convergent light. That is because: regarding parallel plane waves, there is no light-path difference, resulting in the same signal; therefore, no difference signal is detected between the twin light detectors.

In reality, it is a well-known fact that when an etalon receives incidence of divergent light, finesse (described later) of the etalon decreases effectively. In addition, because the etalon is located at a tilt, a number of multiple reflection at the etalon decreases, causing effective decrease of finesse. The decrease of the effective finesse lowers a resolution of etalon, which causes wavelength locking accuracy to be lowered. Moreover, quantity of divergent light that reaches the twin light detectors 20 and 22 decreases, resulting in lower optical efficiency of laser light. In addition, as regards the laser light source module, concurrently preparing monitoring-light for keeping a fiber output constant is required.

SUMMARY OF THE INVENTION

Embodiments of the present invention provide an optical system and its control system, which lock each lasing wavelength of a laser light source to a specified value. This optical system can be separately operated as a wavelength locker module; it can also be built into an optical-fiber transmitter module comprising a laser light source.

As regards Wavelength Division Multiplexing optical-fiber communication systems, increase of communication capacity by increasing wavelength multiplicity is inevitably required. Under such circumstance, it is strongly required that crosstalk between wavelength channels caused by the narrowband wavelength-channel interval is eliminated. That is to say, as a more specific technology, a device, which detects a wavelength shift of a laser light source to give its feedback to the laser light source and locks laser wavelengths with high accuracy and with high optical efficiency, is built into a module. Moreover, wavelength locking is required throughout a broad wavelength portion corresponding to the ITU-TS grid.

As a wavelength filter for detecting a wavelength shift, there is the Fabry Perot etalon described above. However, we should make full use of performance of the etalon from the viewpoints of: resolution of wavelength selection; optical efficiency; increase in density of implementation into a laser light source module; mechanical stability; compensation for a locking-wavelength shift caused by a change in temperature; and the like.

Furthermore, the etalon is a kind of parallel plane plates. Because of it, when the etalon is placed in parallel luminous flux, its reflected light returns the laser light source, which constitutes a second resonator. As a result, laser mode competition causes fluctuations of a laser output.

The embodiments according to the present invention solve the technical problems described above.

A first typical aspect of the present invention is optical-fiber communication equipment comprising at least, a laser light source, a means for changing light of the laser light source to a parallel plane wave to form a parallel light path, a wavelength selection means, and a plurality of light detectors, wherein:

said wavelength selection means is located in the parallel light path;

said wavelength selection means has at least two transmission bands;

the parallel plane wave is divided into at least two pieces of light including light that is transmitted through said wavelength selection means of the parallel plane wave and light that passes through a medium having optical characteristics different from that of the light transmitted through the wavelength selection means;

the plurality of light detecting means detects each of the light; and a given signal based on a difference signal between photocurrents, which have been output from the plurality of light detecting means, is supplied to said laser light source as feedback.

A second typical aspect of the present invention is optical-fiber communication equipment comprising at least, a laser light source, a means for changing light of the laser light source to a parallel plane wave to form a parallel light path, a wavelength selection means, and a plurality of light detectors, wherein:

said wavelength selection means is located in the parallel light path;

said wavelength selection means has at least two transmission bands;

the parallel plane wave is divided into at least two pieces of light including light that is transmitted through said wavelength selection means of the parallel plane wave and light that is not transmitted through said wavelength selection means;

the plurality of light detecting means detect each of the light; and a given signal based on a difference signal between photocurrents, which have been output from the plurality of light detecting means, is supplied to said laser light source as feedback.

In the embodiments of the present invention, how much an emitting wavelength of the laser light source is shifted from a desired lasing wavelength is detected. Therefore, by changing the laser light source so that the difference signal becomes zero or a constant value, it is possible to eliminate the shift of the emitting wavelength from the desired lasing wavelength. Also in other aspects and embodiments according to the present invention described below, a method for eliminating a lasing-wavelength shift is basically similar to that described above.

In the present invention, parallel plane waves are used. Therefore, when taking several measures to detect a wavelength, there is less loss of light, which ensures extremely high optical efficiency. On the other hand, if divergent light is used, light divergence causes a loss of light, resulting in low optical efficiency.

In addition, as preferred measures, a change in transmission characteristics of the wavelength selection means due to temperature is compensated. In its typical example, an information storing component is located in optical-fiber communication equipment, and a laser light source has a temperature detecting means. On the other hand, the information storing component stores temperature characteristics of light transmission portion of the wavelength selection means. A lasing-wavelength shift of the laser light source from a desired wavelength is compensated according to a signal from the temperature detecting means and the stored temperature characteristics of light transmission portion of the wavelength selection means. This method is extremely useful for compensating a shift from a channel grid wavelength of Wavelength Division Multiplexing optical-fiber communication described later. As regards said division of the parallel plane wave, a typical example is that both transmitted light and reflected light of the wavelength selection means are provided, or that a means for dividing a transmitted light's light path into a plurality of paths is provided. Specific dividing methods are described later.

Such configuration permits lasing wavelengths of a laser light source to be fixed with extreme accuracy. This configuration uses parallel light as described above, which ensures extremely high optical efficiency. Therefore, it is possible to achieve extremely high accuracy for its control.

As said laser light source, a diode laser device having a normal APC (Automatic Power Control) or a diode laser device having a wavelength controlling means in the device itself can be used. In the diode laser device having a wavelength controlling means in the device itself shown as an example, a local temperature controlling means (for example, a heater) is located in proximity to a laser lasing portion, and this temperature control prevents lasing frequencies of laser lasing from varying. There is also another example: refractive index modulation portion for controlling laser lasing wavelengths is located in proximity to a laser lasing portion; a local temperature controlling means (for example, a heater) is located in proximity to the refractive index modulation portion; and this temperature control prevents lasing frequencies of laser lasing from varying. There is also another example: a current applying means is provided in this refractive index modulation portion to modulate a refractive index by injection current. Examples of the diode laser device having a wavelength control means are described in detail in description of the preferred embodiments. In the embodiments of the present invention, the signal based on a difference signal between the photocurrents is supplied to the various laser-wavelength controlling means as feedback. Application of the present invention using such wavelength-variable diode laser device enables control with higher accuracy and fineness.

In addition, generally, the diode laser device has a means for controlling the device's temperature. The signal based on a difference signal between the photocurrents can be supplied to this temperature controlling means as feedback. This method enables us to realize more stable lasing as compared with simple feedback to APC described above. A typical example of the means for controlling temperature of the diode laser device is for example a Peltier cooler. The diode laser device is usually put on the top of this Peltier cooler.

As the means for changing light of a laser light source to a parallel plane wave to form a parallel light path, general collimator elements including for example aspherical lens, lens assemble, ball lens, and selfoc lens can be used with satisfaction. Regarding the parallel plane wave, it is desirable to have flatness that is ten times or less a wavelength, taking the object of the present invention into consideration.

As the parallel plane wave, there are light that is emitted in a direction of information transmission, and light that is emitted in its opposite direction. The optical-fiber communication equipment can be configured using any of the light. Additionally, regarding a connection from the diode laser device to the means for forming a parallel light path, light may be directly introduced into the means, or a desired optical component may be located between them. However, when applying the present invention, in either case, a desired module can be configured as necessary. What is required in the present invention is that light from the diode laser device can be changed to a parallel plane wave.

A typical example of said wavelength selection means having at least two transmission bands is a wavelength-selection transmission type filter having a Fabry Perot structure. A typical example of the filter is a Fabry Perot etalon (generally, it is simply called 'etalon' for short; also in the specification of the present invention, hereinafter it is simply referred to as 'etalon'). There are several kinds of Fabry Perot interference type etalons: an etalon of which a physical distance between reflection films is fixed; an etalon of which the distance is variable by PZT driving. In addition, the etalon is also divided into two groups: an etalon in which a material between the reflection films is a gas; and an etalon in which the material is a solid matter. The former is called air space type or air gap type; the latter is called solid type. Basically, the present invention can be applied to any type.

As a Fabry Perot type etalon, a configuration described below is extremely useful for fixing a plurality of wavelengths of a laser light source to given wavelengths. To be more specific, the following settings are provided: a refractive index of an etalon medium is within a range of 1.0 to 4.0; surface reflectivities of both reflection planes of the medium are within a range of 20 to 70%; and a thickness of the medium is set so that a plurality of light transmission portions having desired wavelengths are generated at given wavelength intervals, and that one of the plurality of light transmission portions corresponds to an emitting wavelength desired by the laser light source. In this connection, although it depends on designs of members for light detection as a matter of course, for said surface reflectivities of both reflection planes of the medium, a range from 20 to 50% is generally advantageous to error-signal detection. That is because a change in transmission characteristics of the etalon by a change in wavelength results in a large portion for use.

Using this configuration, the etalon permits all of a plurality of transmitting wavelengths to be kept a constant value. Among other things, by matching transmission characteristics of the etalon with a channel grid in Wavelength Division Multiplexing optical-transmission, wavelength stabilization with high accuracy can be achieved extremely simply and easily. Moreover, regardless of using a plurality of wavelengths, the etalon enables easy implementation to a usual module.

Furthermore, when associating an emitting wavelength of the laser light source with the light transmission portion provided by the wavelength selection means, it is more desirable to equate it to an emitting wavelength corresponding to a desired wavelength that is shifted to the highest transmittance wavelength portion in this transmission portion. This embodiment can be said to be more practical. That is because if an emitting wavelength of the laser light source exists in a portion where a relation between a light wavelength and the transmission characteristics has a steep gradient, a shift of the emitting wavelength can be detected more effectively. In other words, this means that a wavelength resolution is higher than other means. If a relation between a light wavelength and the transmission characteristics of the wavelength selection means shows relatively flat characteristics, a change in photocurrent by a shift of the emitting wavelength is relatively small.

As described above, in the present invention, it is required that the parallel plane wave is divided into at least two pieces of light including light that is transmitted through said wavelength selection means and light that passes through a medium having optical characteristics different from that of the light transmitted through the wavelength selection means. As a means for passing the parallel plane wave through the medium having optical characteristics different from that of the light transmitted through the wavelength selection means, several methods are considered. In this case, the 'medium having optical characteristics different from that of the light transmitted through the wavelength selection means' means a light path containing a reflector, a light-path dividing means, or a light path in which they are combined, if the medium as the light path is a translucent solid medium, air or gas. What is required is that the light path can obtain light intensity different from that of the light transmitted through the wavelength selection means. By the way, the light path using air as a media means a light path in a general space. If an example of a light-path dividing means described below is allowed for, its meaning can be sufficiently understood.

As the light-path dividing means, using a usual light-path dividing means is sufficient. Its typical examples are an amplitude-dividing beam splitter and a wavefront-dividing beam splitter.

In addition, for the purpose of dividing the light path into two or more, several methods are considered. Their typical examples are listed as below. From a first to a fifth example are examples in a case where the amplitude-dividing beam splitter is used as a light-path dividing means; and a sixth example is an example in a case where the wavefront-dividing beam splitter is used.

The first example is: a light path is divided into reflected light of said light-path dividing means and transmitted light of the light-path dividing means; this transmitted light of the light-path dividing means is introduced into the wavelength selection means; and then a difference signal is obtained from transmitted light of the wavelength selection means and said reflected light of the light-path dividing means.

The second example is: a light path is divided into reflected light of said light-path dividing means and transmitted light of the light-path dividing means; this transmitted light of the light-path dividing means is introduced into the wavelength selection means; and then a difference signal is obtained from reflected light of the wavelength selection means and said reflected light of the light-path dividing means.

The third example is: a light path is divided into transmitted light of said light-path dividing means and reflected light of the light-path dividing means; this reflected light of the light-path dividing means is introduced into the wavelength selection means; and then a difference signal is obtained from transmitted light of the wavelength selection means and said transmitted light of the light-path dividing means.

The fourth example is: a light path is divided into transmitted light of said light-path dividing means and reflected light of the light-path dividing means; this reflected light of the light-path dividing means is introduced into the wavelength selection means; and then a difference signal is obtained from reflected light of the wavelength selection means and said transmitted light of the light-path dividing means.

The fifth example is: reflected light of said light-path dividing means is introduced into the wavelength selection means; and then a difference signal is obtained from transmitted light of the wavelength selection means and reflected light of the wavelength selection means.

The sixth example is: a wavefront is divided into two; a first portion of this divided wavefront is introduced into the wavelength selection means; and then a difference signal is obtained from transmitted light of the wavelength selection means and light intensity of a second portion of said divided wavefront.

The seventh example is: a wavefront is divided into two; a first portion of this divided wavefront is introduced into the wavelength selection means; and then a difference signal is obtained from reflected light of the wavelength selection means and light intensity of a second portion of said divided wavefront.

A third typical aspect of the present invention is optical-fiber communication equipment comprising at least, a laser light source, a means for changing light of the laser light source to a parallel plane wave to form a parallel light path, a wavelength selection means, and a plurality of light detectors, wherein:

said wavelength selection means is located in the parallel light path;

said wavelength selection means has a plurality of light transmission portions existing at given wavelength intervals;

an emitting wavelength of said laser light source is equivalent to one of the light transmission portions provided by the wavelength selection means;

the parallel plane wave is divided into at least two pieces of light including light that is transmitted through said wavelength selection means of the parallel plane wave; and light that passes through a medium having optical characteristics different from that of the light transmitted through the wavelength selection means;

the plurality of light detecting means detects each of the light; and a given signal based on a difference signal between photocurrents, which have been output from the plurality of light detecting means, is supplied to said laser light source as feedback.

Using this embodiment enables the following applications from a new viewpoint. A second main viewpoint of the present invention is a method by which a free spectral range of said wavelength selection means is matched with a channel grid interval of Wavelength Division Multiplexing optical-fiber communication and then a wavelength of the laser light source is changed so that this wavelength is fixed to a desired value of the grid. An important point of this example is that a free spectral range of the wavelength selection means can be matched with a channel grid interval of Wavelength Division Multiplexing optical-fiber communication. By utilizing this for wavelength locking of the laser light source, it is possible to equate an emitting wavelength of the wavelength-control laser device to a channel grid of Wavelength Division Multiplexing optical-fiber communication with higher accuracy and simplicity. By the way, the method for fixing an emitting wavelength of the laser light source can be applied in the same manner as that described in the first embodiment.

In addition, for this embodiment, a laser light source or a diode laser device, which comprises a plurality of lasing portions that enable lasing with a plurality of lasing wavelengths, can be used.

In this case, corresponding to each lasing portion, the measures to fix an emitting wavelength as described above are taken. In this embodiment, a free spectral range of the wavelength selection means is matched with a channel grid interval of Wavelength Division Multiplexing optical-fiber communication. Therefore, only one wavelength selection means provides measures to fix a plurality of lasing wavelengths. In this embodiment, extremely simply measures are taken.

A third main viewpoint of the present invention is: said laser light source is located at a position that is shifted from an optical axis of a means for changing light of the laser light source to a parallel plane wave to form a parallel light path; or a normal line of an incident end face for said wavelength selection means or the laser-light dividing means is located so that the normal line crosses the optical axis of the means for changing light of the laser light source to a parallel plane wave to form a parallel light path.

The most typical means for changing a laser light source to a parallel plane wave is a collimator element. If the third viewpoint of the present invention is more specifically described from this standpoint, said laser light source is located at a position that is shifted from an optical axis of the collimator element, or a normal line of an incident end face for each of said wavelength selection means and said laser-light dividing means is slanted off from the optical axis of the collimator element so that reflected light from each of the optical element edges does not return to the laser light source. Using this embodiment in combination with the first or the second embodiment provides an extremely useful embodiment for practical use.

In addition, the optical-fiber communication equipment according to the present invention is a laser device handling extremely stable lasing wavelengths, which is useful for various kinds of optical systems. Among other things, the optical-fiber communication equipment according to the present invention is useful when it is applied to Wavelength Division Multiplexing optical-fiber communication systems.

DESCRIPTION OF THE PREFERRED EMBODIMENTS

Figure 1:
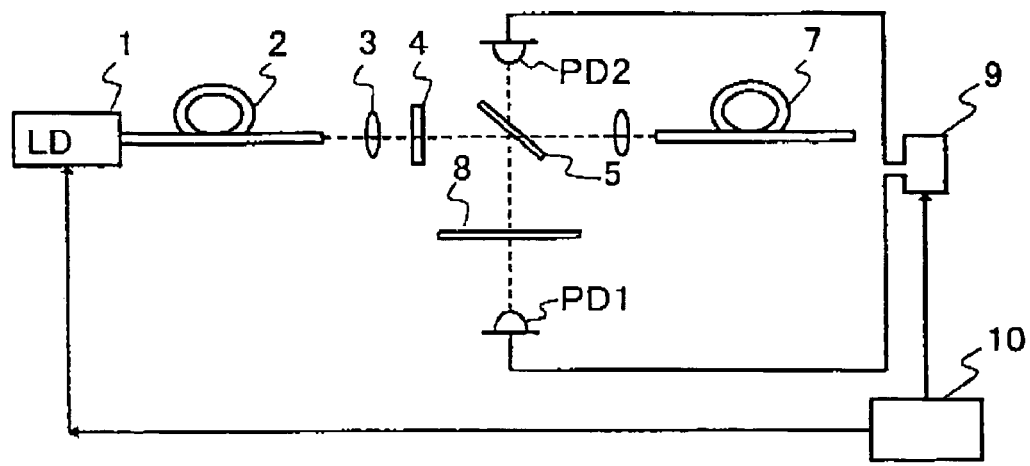
FIG. 1 is a configuration diagram illustrating a conventionally known wavelength-control light source.
Figure 2:
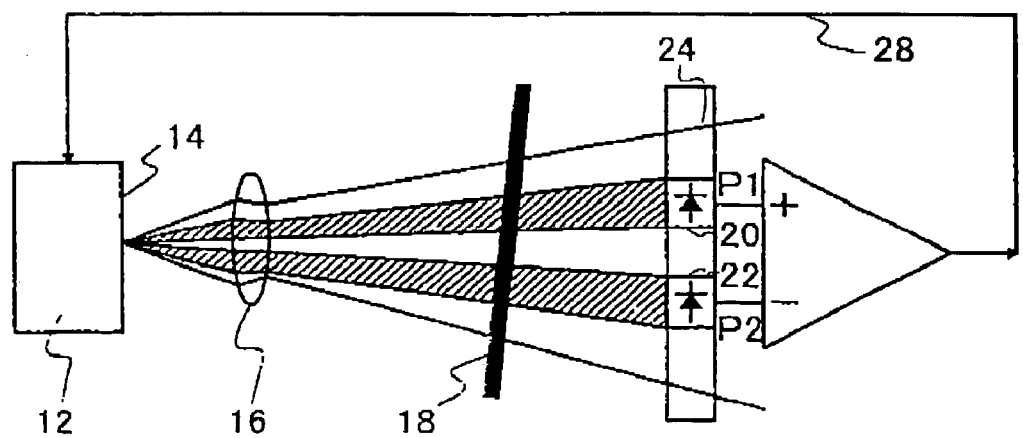
FIG. 2 is a diagram illustrating an example of a wavelength monitoring control device for a Wavelength Division Multiplexing optical-fiber communication system that uses an etalon.

Before explaining embodiments of the present invention, main embodiments of the present invention are summarized as below. After that, a specific configuration of a Fabry Perot type etalon, which is a main component of the present invention, is described in detail beforehand.

A first embodiment of the present invention is optical-fiber communication equipment, wherein:

divergent light, which has been introduced directly or indirectly from a backward position or a forward position of a wavelength-variable laser light source or a light source where a modulator of the wavelength-variable laser light source is integrated, is changed to a parallel plane wave having flatness ten times or less as much as a wavelength by a collimator element to form a parallel light path;

a wavelength filter having at least two or more transmission peaks is located in said parallel light path;

transmitted light or reflected light of said wavelength filter is divided by a light-path dividing means;

said divided light is introduced into a plurality of light detectors;

shifted quantity of a lasing-wavelength of said laser light source is detected by a difference between photocurrents passing through each of said light detector;

a means for controlling a wavelength of the laser light source is provided so that the difference between the photocurrents becomes a constant value;

and said laser light source is located at a position that is shifted from an optical axis of the collimator element, or a normal line of an incident end face for said wavelength filter or said laser-light dividing means is slanted off from the optical axis of the collimator element so that reflected light from each of the optical element edge does not return to the laser light source.

A second embodiment of the present invention is optical-fiber communication equipment according to the present invention, wherein:

said wavelength filter is a Fabry Perot type etalon; and the light-path dividing means located in the parallel light path is an amplitude-dividing beam splitter. This is a typical example for practical use.

A third embodiment of the present invention is optical-fiber communication equipment according to the present invention, wherein:

said optical-fiber communication equipment comprises a means for matching a free spectral range of the Fabry Perot etalon with a channel grid interval of Wavelength Division Multiplexing optical-fiber communication, and for changing a wavelength of the laser light source so that this wavelength is fixed to a given value of the grid.

The emitting wavelength of the laser light source has been considered up to this point. A fourth embodiment of the present invention is measures to control a light output of the laser light source. Generally, such light output is monitored by light that is emitted from an edge opposite to a light output used for information exchange. However, if embodiments shown in the present invention are used, it is advantageous to keep a light output of the laser light source constant so that a photocurrent passing through at least one of the plurality of light detectors or a sum of photocurrents passing through at least two of the light detectors becomes constant.

A fourth embodiment of the present invention is optical-fiber communication equipment according to the present invention, wherein:

said wavelength filter is a Fabry Perot etalon having a taper of a wavelength level for the laser light source, or a Fabry Perot etalon constructed of two parallel plane plates, which are made from glass materials having a different refractive index each other and are connected together in a direction of a plane; and said optical-fiber communication equipment comprises a means for:

configuring said wavelength filter so that a light-path difference is generated between parallel plane waves passing through different positions of an incidence plane of the etalon;

dividing transmitted light of the Fabry Perot etalon spatially; and introducing the divided light into two light detectors respectively.

A fifth embodiment of the present invention is optical-fiber communication equipment according to the present invention, wherein:

said Fabry Perot etalon has a structure including at least two transparent plates, by which a product of a refractive index and a length for one transparent plate reverses in sign as compared with the product for the other transparent plate; and thereby a change in light-path difference of light, which pass through the Fabry Perot etalon, caused by temperature is decreased.

A sixth embodiment of the present invention is optical-fiber communication equipment according to the present invention, wherein:

said optical-fiber communication equipment comprises a means for:

matching a free spectral range of the Fabry Perot etalon with a channel grid interval of Wavelength Division Multiplexing optical-fiber communication;

storing temperature characteristics of transmission peaks of the Fabry Perot etalon into a semiconductor memory; and compensating a shift of an emitting wavelength of said wavelength-variable laser light source from a channel wavelength of said Wavelength Division Multiplexing optical-fiber communication by a signal from a temperature detector.

A seventh embodiment of the present invention is optical-fiber communication equipment according to the present invention, wherein:

the temperature characteristics of transmission peaks of the Fabry Perot etalon is compensated by setting a thickness of said Fabry Perot etalon, which is determined by a channel grid interval of Wavelength Division Multiplexing optical-fiber communication, to a value that is shifted from a free spectral range.

An eighth embodiment of the present invention is optical-fiber communication equipment according to the present invention, wherein:

a portion or all of said laser-wavelength controlling means is built into a laser-light-source module package.

A ninth embodiment of the present invention is optical-fiber communication equipment according to the present invention, wherein:

a plurality of laser light sources having said laser-wavelength controlling means are located in parallel; and said optical-fiber communication equipment comprises a means for combining variable-wavelength portions covered by each laser light source.

Next, a specific configuration of a Fabry Perot type etalon is described in detail beforehand. FIG. 3 is a diagram used for explaining a principle of an etalon, which is applied to the present invention. The diagram illustrates a cross section of a basic element and a condition of light. A basic configuration of the etalon is a parallel plane plate having high parallelism as well as high flatness. Between reflection planes, in other words, between translucent films, a gas or a solid matter is placed. To be more specific, the etalon is an optical resonator comprising a pair of opposed layers having a high reflectivity, between which a medium is sandwiched as a spacer. Its specific configuration is, for example, a resonator using a glass substrate as a base, on which each layer of a reflector, a spacer, and a reflector is laminated one by one. Another example is a resonator using a glass substrate as a base; on both sides of the glass substrate, a reflector layer is formed. The etalon associated with the present invention is a wavelength-selection transmission type filter. It is important for the etalon to have two or more transmission bands. As regards this point, basic characteristics of the etalon are different from those of a bandpass filter using so called a interference-film multilayer filter that is conventionally known.

Figure 3A:
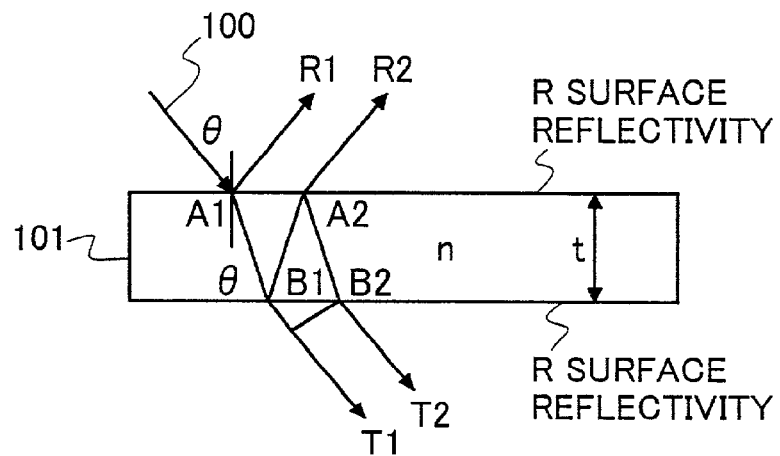
FIG. 3A is a sectional view illustrating a condition of light by an etalon.

Light, which has been transmitted through this etalon, generates a peak repeatedly for a shift of that wavelength. Light 100, which reaches the etalon at an incident angle θ, is reflected by two surfaces of an etalon 101 repeatedly and many times. In FIG. 3A, A1 and A2 exemplify positions of the incident light. In addition, B1 and B2 shown in FIG. 3A exemplify positions through which light T1 and T2 are transmitted. R1 and R2 exemplify reflected light. As a result of interference of many generated wavefronts, the following transmitted light $I_t$ is obtained:

$$I_t = 1/(1 + F \sin^2(\varnothing)) \qquad (1)$$

where $$F = 4R/(1-R)^2 \quad (2),$$

and $$\varnothing = (2\pi nt/\lambda)\cos\theta' \quad (3)$$

Moreover, R is surface reflectivity of each side 1, 2 of the etalon 101; n is a refractive index of the etalon; t is a thickness of the etalon; $\lambda$ is a light wavelength; and $\theta'$ is an angle given by light in the etalon.

Here, Snell laws of refraction holds as below.

$$\sin\theta = n\sin\theta' \quad (4)$$

Figure 3B:
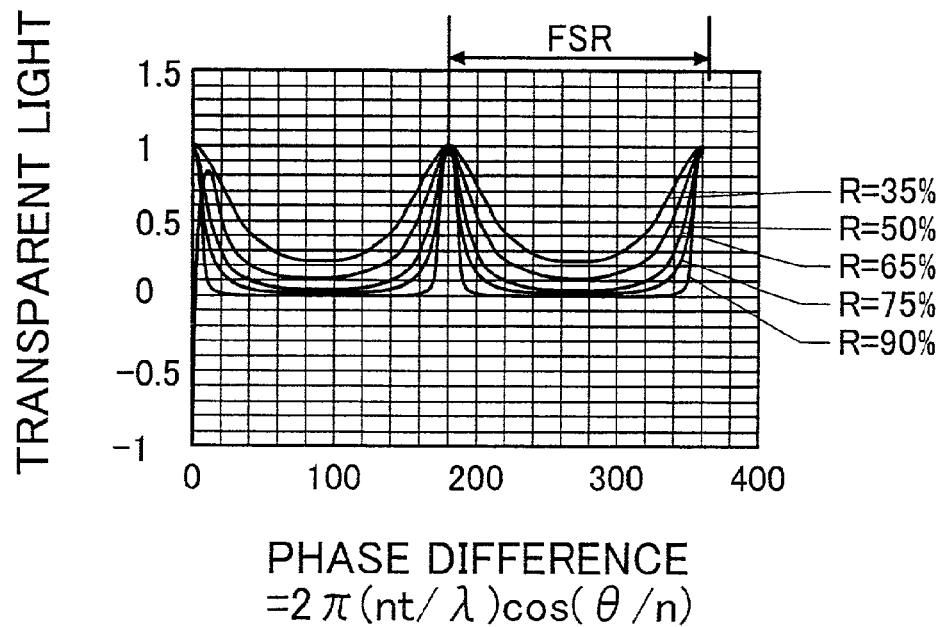
FIG. 3B is a diagram illustrating an example of a relation between phase difference and transparent light regarding an etalon.

FIG. 3B is a graph of the equation (1) using surface reflectivity R as a parameter.

In FIG. 3B, a vertical axis is intensity of transmitted light (arbitrary unit), and a horizontal axis is a phase difference. This phase difference is expressed in $2\pi(nt/\lambda)\cos(\theta/n)$.

At this point, finesse $\Phi$ is defined as a parameter that expresses sharpness of resonance of the etalon.

$$\Phi = (\pi\sqrt{F})/2 \quad (5)$$

In addition, an interval between repeated peaks is called FSR (Free Spectral Range).

As a wavelength range:

$$FSR = \lambda^2/2nt \quad (6)$$

As a frequency range:

$$FSR = c/2nt \quad (7)$$

(where c is speed of light)

There is the following relation between finesse $\Phi$ and FSR:

$$\Phi = FSR/\epsilon \quad (8)$$

where $\epsilon$ is a half-width of a transmission peak.

Therefore, designing a etalon's thickness t, a refractive index n, and surface reflectivity R permits FSR to match with ITU-TS grid.

Matching FSR with ITU-TS grid enables us to detect an wavelength error by wavelength selection characteristics having desired sharpness over a wide wavelength range.

For this purpose, in particular, the following ranges are often used: a refractive index of an etalon's medium ranging from 1.0 to 4.0; and surface reflectivities of both reflection planes of said medium ranging from 20 to 70%. Moreover, determining a thickness of said medium by $t = c/(2n \cdot FSR)$ enables us to obtain an etalon of which FSR corresponds to ITU-TS grid. In this manner, generating a plurality of light transmission portions having desired wavelengths at given wavelength intervals permits one of the plurality of light transmission portions to be equivalent to an emitting wavelength desired by the laser light source. By the way, a thickness of an etalon's medium often ranges approximately from 0.1 to 10 mm. As mentioned above, a range of surface reflectivity from 20 to 50% is more practical.

Figure 4:
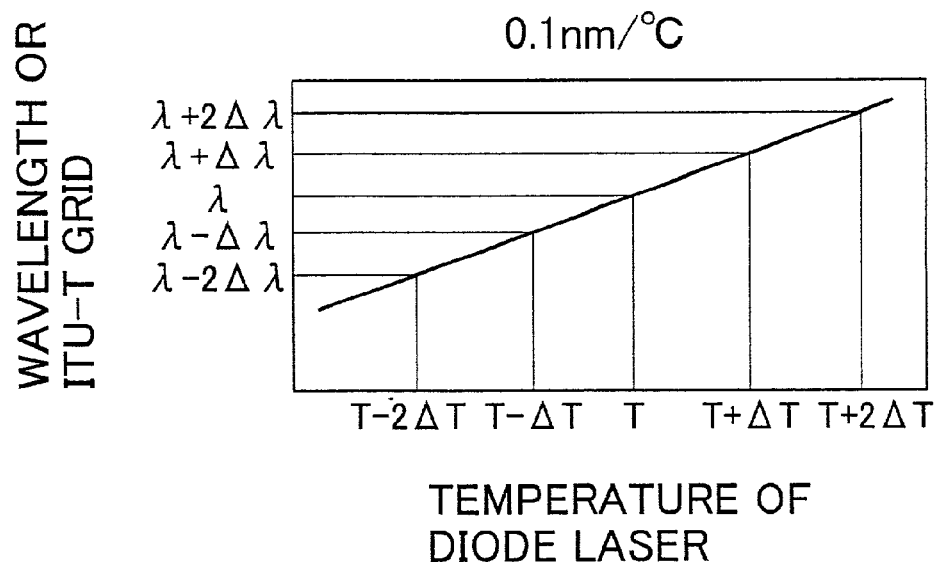
FIG. 4 is a diagram illustrating an example of a relation between temperature and a lasing wavelength in a semiconductor laser device.

A second factor constituting a problem solving means of the present invention is a laser light source. As is the case with a semiconductor laser for example, a wavelength of a laser light source can be changed by changing a driving current or an operation temperature. FIG. 4 is a diagram illustrating an example of a relation between temperature and lasing wavelength regarding a semiconductor laser. This laser's lasing wavelength corresponds to the ITU-T grid described above. A vertical axis is indicated as the ITU-T grid for this purpose. As regards a general semiconductor laser, increase in temperature by 1° C. changes a wavelength by 0.1 nm as shown in FIG. 4. In the present invention, a laser light source like this, which is capable of changing an emitting wavelength, is used. As a laser light source, divergent light from a backward position or a forward position of a laser light source, where a modulator for modulating its lasing intensity is integrated, may be directly used; or divergent light, which has been introduced indirectly from the light source after passing through optical waveguides such as a fiber, a modulator, and a switch, may be used.

Figure 5:
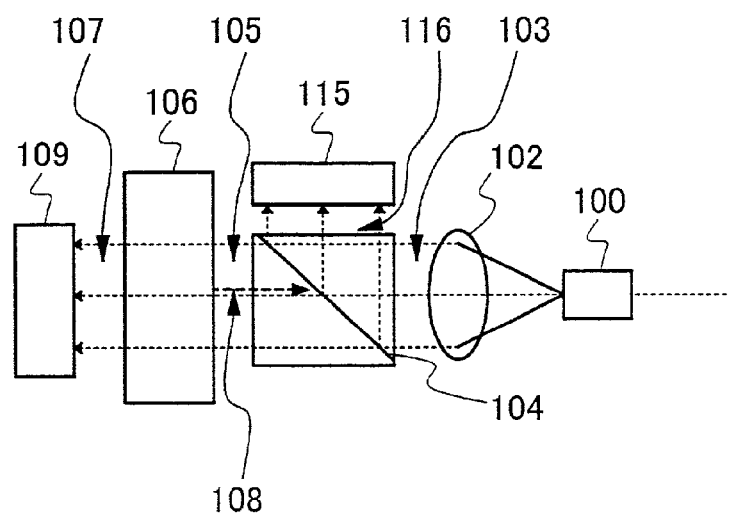
FIG. 5 is a configuration diagram illustrating an example of a wavelength-control light source according to the present invention.

FIG. 5 shows a basic configuration of a problem solving means according to the present invention. To be more specific, divergent light from a laser light source 100 such as the various laser light sources described above is condensed by a collimator 102, such as a lens, and an element comprising a diffraction grating, to form a light path 103 as a parallel plane wave. Flatness of the obtained parallel plane wave must be at a maximum ten times or less as much as a wavelength on a wave aberration basis. A light-path dividing element 104, which is a component of the present invention, is located in a parallel luminous flux 103 obtained in this manner. In its branched light, a light detector 115 is located to monitor a light output from the laser light source 100.

On the other hand, a wavelength filter 106 such as an etalon, which has two or more transmission peaks periodically, is located in transmitted light 105 of the light-path dividing element 104. A light detector 109 is placed behind the wavelength filter 106 to receive light 107 of which a wavelength is selected. An error signal is generated by a difference between a photocurrent Pm supplied to the light detector 115 for monitoring a light output and a photocurrent Pt that is supplied according to the equation (1) to the light detector 109 for monitoring a wavelength placed behind the etalon 106. A given signal is supplied to the laser light source 100 as feedback so that this value becomes zero or a constant value.

That is to say, the error signal is expressed in the following equation:

$$A(\lambda) = Pt - Pm \quad (9)$$

Figure 6:
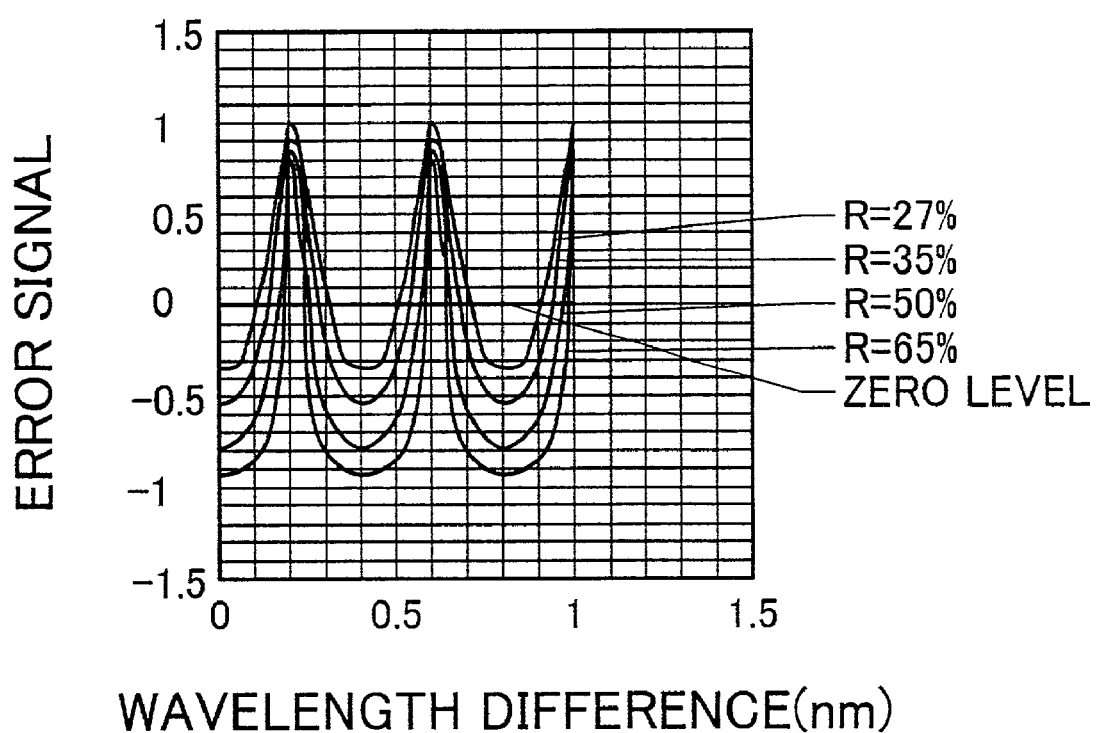
FIG. 6 is a diagram illustrating an example of relations between a wavelength difference and a error signal in an exemplified module of the present invention.

FIG. 6 illustrates the equation (9). A horizontal axis is a wavelength difference, and a vertical axis is an error signal (arbitrary unit). This is an example showing that an optical system for wavelength locking is located in front (a fiber side).

As an error signal, the following signal, which is normalized by light quantity, can also be used:

$$A(\lambda) = (Pt - Pm)/(Pt + Pm) \quad (10)$$

Additionally, in the present invention, as described later, a difference between reflected light and transmitted light from the etalon 106 can also be used as an error signal.

Moreover, in actual signal processing, if a difference signal is obtained from both signals based on the photocurrents, obtaining the difference signal by multiplying either or both of the signals by a desired coefficient is also taken into consideration. For example, when transmitted light PD1 and reflected light PD2 are compared, a difference signal is defined as PD1−αPD2, which is kept to be zero or a given value.

Concerning the locations described above, when reflected light from surfaces of the light-path dividing element 104 and the etalon 106 return to the laser light source 100, a second resonator for the semiconductor laser is formed outside, which causes a problem of laser output fluctuations.

Figure 7:
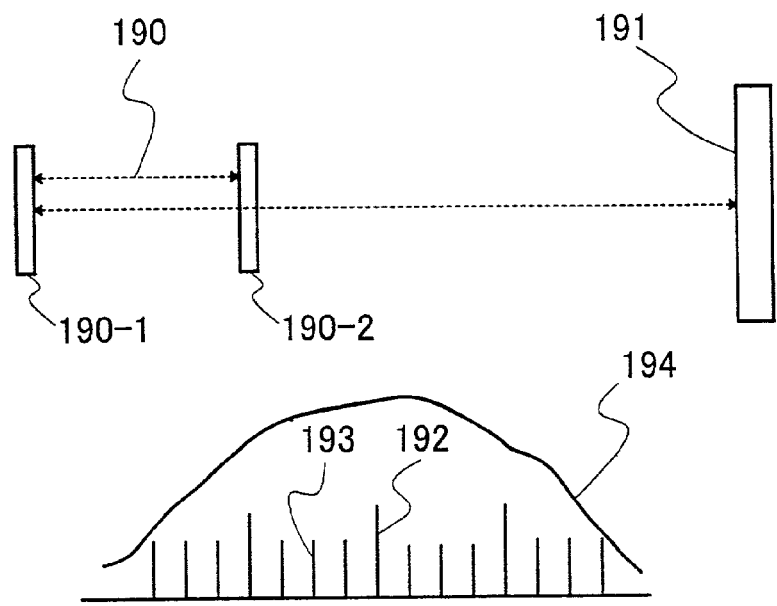
FIG. 7 is a diagram illustrating an example of a condition of an external resonator in a semiconductor laser device.

That is to say, FIG. 7 shows a relation between a resonator 190 of the semiconductor laser itself and a mirror 191 located outside of the resonator. In FIG. 7, both reflection plates of the resonator 190 are schematically illustrated as 190-1 and 190-2. An upper portion of FIG. 7 shows a relation between this resonator and the mirror, and a lower portion shows a lasing condition. As soon as the outside mirror 191 is placed, an outside resonator mode 193 is newly generated between a semiconductor-laser lasing mode 192 and the mirror 191. Because these modes are within a range of a gain curve 194 of the semiconductor laser, laser lasing may occur. This results in laser mode competition among many modes, causing the laser output fluctuations. The fluctuations are noise that is called feed back noise.

Typical measures to solve this problem are a method as described below. To be more specific, a laser light source is located at a position that is shifted from an optical axis of a means for changing light of the laser light source to a parallel plane wave to form a parallel light path; or a normal line of an incident end face for said wavelength selection means or the laser-light dividing means is located so that the normal line crosses the optical axis of the means for changing light of the laser light source to a parallel plane wave to form a parallel light path.

Figure 8A:
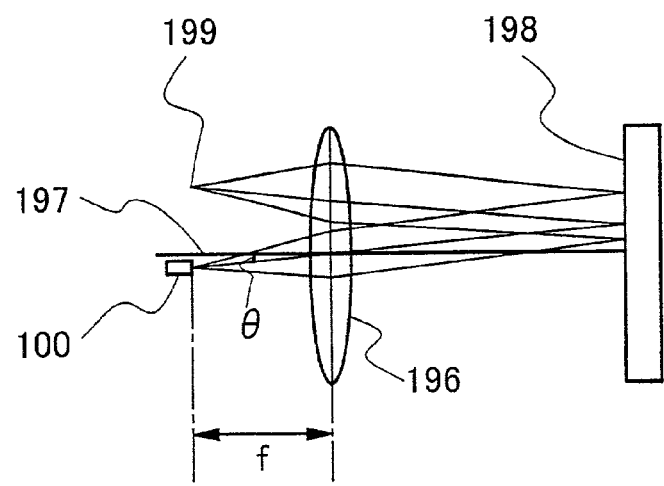
FIG. 8A is a diagram illustrating an example of relations among a semiconductor laser device, a collimator lens, and a light detector.

As a first example, the laser light source 100 is located at a position that is shifted from an optical axis 197 of a collimator lens 196 as shown in FIG. 8A. This permits reflected feedback light from a reflected surface 198 of the etalon or the light detector to be focused on an opposite side 199 of the optical axis. Thus, the reflected light does not return to the laser light source 100. If a focal distance of the collimator lens 196 is f and a lasing size of laser is a, the laser light source is placed at a position that is shifted from the optical axis 197 of the collimator lens 196 by an angle θ. In this case, the angle θ is determined by keeping a relation of fθ>a. As a result of it, reflected light from the reflected surface 198 is condensed at a position 199.

Figure 8B:
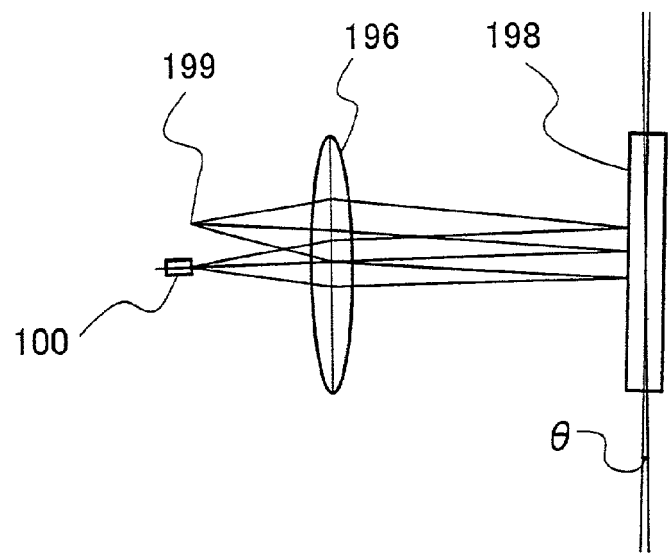
FIG. 8B is a diagram illustrating another example of relations among a semiconductor laser device, a collimator lens, and a light detector.

A second example is a method in which a normal line of the reflected surface 198 of the etalon or the light detector crosses the optical axis 197 of the collimator 196 at an angle θ as shown in FIG. 8B. This prevents reflected feedback light from returning to the laser light source 100. As described above, the angle θ may be determined in a manner similar to that of the first example. As a result of it, reflected light from the reflected surface 198 is condensed at the position 199.

Figure 17:
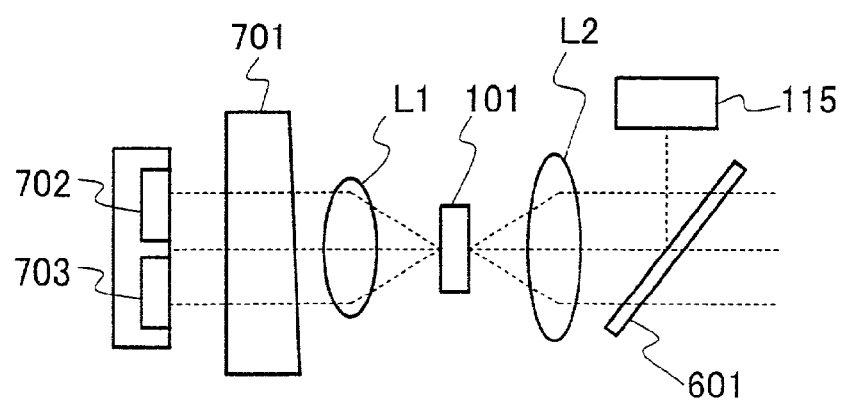
FIG. 17 is a diagram illustrating another example of placement of a wavelength-locking optical system according to the present invention.

In addition, as another means of the present invention, the following means can be used: placing a Fabry Perot etalon having slight a taper into the parallel luminous flux; and receiving light using two light detectors that are placed immediately behind the Fabry Perot etalon. FIG. 17 shows a specific example of this method.

In the case of FIG. 17, a thickness of an etalon 701 varies. Although this example is provided for the purpose of addressing a problem described later, the example addresses the problem of reflected light explained here at the same time. Concerning parallel light from a semiconductor laser source, reflected light from an inclined surface of the etalon does not return to the semiconductor-laser light source as a matter of course. The taper is required to be provided to such an extent that the reflected light does not return to a lasing spot of the laser light source. In this connection, there was an example of a conventional configuration in which an etalon with a shape of a parallel plate is located in a direction where the etalon is inclined at a certain angle. However, in this example, the etalon 701 has a taper at least on one surface. As a matter of course, both surfaces may be provided with a taper. As measures against reflected light, this example enables extremely easy optical adjustment as compared with the conventional example described above, and is practical. In other words, if the parallel-plate shaped etalon is placed at a tilt angle from the laser light source having divergent light, it is required to adjust two angles: a tilt angle of the parallel-plate shaped etalon; and a divergent angle of laser light. In this example, however, laser light is parallel and at the same time a taper angle of the etalon is fixed. This enables us to obtain a laser module having few adjustment points and high accuracy at the time of device implementation.

As described above, this example enables operation as below. Using the etalon with a taper causes a slight shift of a selected wavelength if a position through which light passes is different. When the wavelength of the laser light source is shifted, a photocurrent peak received by each light detector is also shifted. Therefore, an error signal of a wavelength shift is obtained by determining a difference between both photocurrents. Another means can also be used: instead of the taper etalon, connecting two kinds of plane plates, which have a different refractive index each other, together on edges; and generating a light-path difference of light passing through each portion of the plane plates. Because a photocurrent peak received by each light detector is shifted when a wavelength of the laser light source is shifted, this means enables us to obtain an error signal of the wavelength shift in a similar manner by determining a difference between both photocurrents.

In this connection, if a wavelength of the laser light source is changed by temperature, a temperature of the etalon may also changes. In this case, the following problem arises: thermal expansion of the etalon or a change in refractive index due to temperature fluctuates a light-path length nt; and it causes a transmission peak wavelength of the etalon to be shifted, resulting in a shift from a given ITU-TS grid. In order to solve this problem, dividing the etalon to use the divided etalon in combination with a material, of which temperature fluctuation of light-path difference is negative, provides a means that prevents a transmission peak of the etalon from shifting even when temperature is changed. In addition, storing temperature characteristics of the etalon into a semiconductor memory provides a means for locking a wavelength at a value that is compensated for each operation temperature. Moreover, creating an etalon in such a manner that its thickness t is slightly changed to permits FSR to be shifted from ITU-TU grid provides a method for compensating a shift of a transmission peak due to a change in temperature.

Furthermore, because a wavelength-locking optical system according to the present invention enables compact design, the optical system can be built into an optical-fiber communication module comprising a laser light source. Additionally, it is possible to prepare a light source for a high-capacity Wavelength Division Multiplexing optical communication system, which is capable of locking and fixing a wavelength throughout a range of a wavelength portion wider than that of a single laser light source, by: aligning a plurality of laser light sources, of which a wavelength-variable portion is continuously linked one another, in parallel; and locating the wavelength-locking optical system according to the present invention before a position where light from the plurality of laser light sources are gathered into one fiber by a wavelength multiplexer.

As described above, using a configuration comprising basic elements according to the present invention as a means for solving the problems enables us to exploit the full performance of the etalon. That is to say, the technical problems are solved, which could not be conventionally overcome from the viewpoints of: resolution of wavelength selection; optical efficiency; increase in density of implementation into a laser light source module; mechanical stability; compensation for a locking-wavelength shift caused by a change in temperature; and the like.

Figure 9:
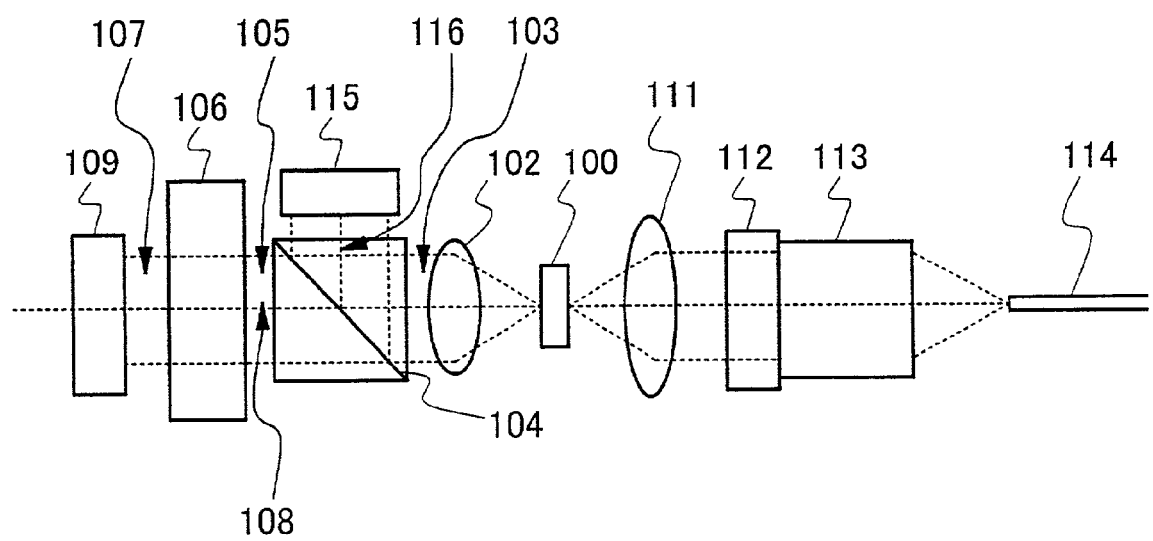
FIG. 9 is a diagram illustrating an example of placement of a wavelength-locking optical system according to the present invention.
Figure 10:
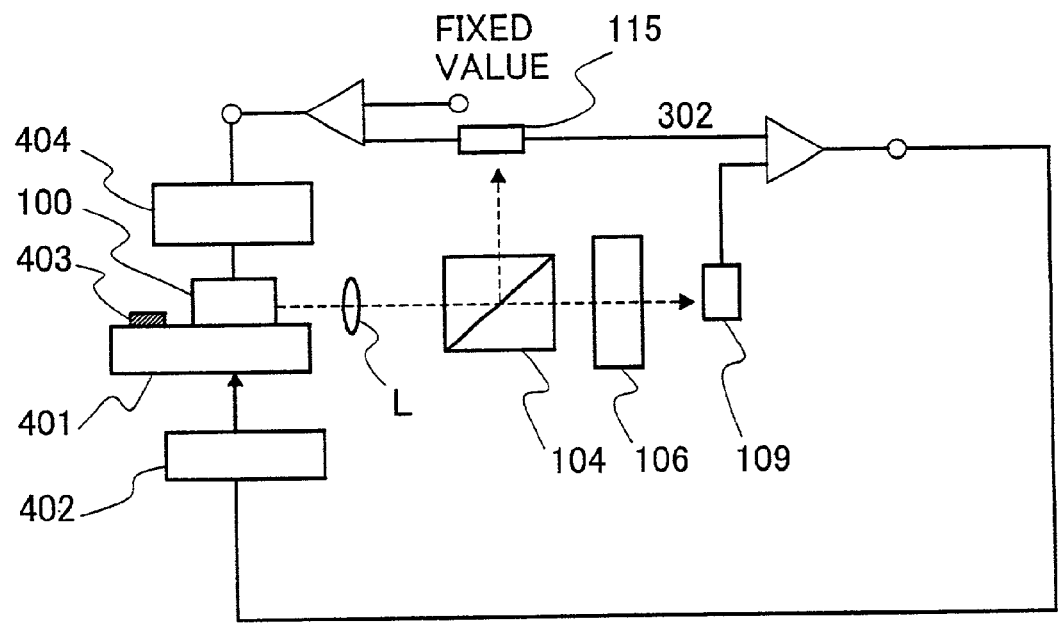
FIG. 10 is a configuration diagram illustrating another example of a wavelength-control light source according to the present invention.

FIG. 9 is a schematic diagram of a main portion illustrating the first embodiment of the present invention. FIG. 9 shows a portion for detecting a wavelength shift of a light-source's lasing wavelength. FIG. 10 shows an example of a specific configuration for controlling the light-source's lasing wavelength according to a result of the detection.

A wavelength-variable light source 100 is, for example, a DFB (Distributed Feed Back) type or a Fabry Perot type semiconductor laser. As another example, the wavelength-variable light source is a light source in which an electric-absorption type modulator is integrated into DFB type semiconductor laser. In such wavelength-variable laser light source 100, an emitting wavelength λ changes in response to a change in operation temperature T. Because of it, the wavelength-variable semiconductor laser device like this is capable of selecting a wavelength corresponding to ITU-TS grid by controlling operation temperature.

This example shows detection of a lasing-wavelength shift of a laser light source by: dividing a light path of laser light; transmitting one of the light through an etalon; and measuring both intensities of light transmitted through the etalon and light that is not transmitted through the etalon.

Light for information exchange 112 of the wavelength-variable laser light source 100 is collimated by a collimator 111, and combined into an optical fiber 114 through a focus lens 113. Generally, this light is called front emitted light of the wavelength-variable laser light source 100.

A configuration of an optical system for wavelength locking is described as below. To be more specific, the light for information exchange 112 of the wavelength-variable laser light source 100 and light on its opposite side form parallel light 103 by means of a collimator 102. This parallel light has flatness that is at a maximum ten times or less as much as a wavelength on a wave aberration basis. Generally, said light for information exchange and the light on its opposite side are called back emitted light of the wavelength-variable laser light source 100. The parallel light 103, which has been obtained in this manner, is divided into transmitted light 105 and reflected light 116 by a light-path splitter 104. As the light-path splitter 104, there is, for example, a light-path splitter having a configuration in which triangle prisms are connected together, or a light-path splitter having a configuration in which a dielectric thin film is coated on a parallel plane plate.

The transmitted light 105 further reaches an etalon 106. As a result, each of light, which has been multiple-reflected inside the etalon, interferes one another, which produces a transmission peak expressed in the equation (1). This transmission peak appears repeatedly in response to a change in wavelength. A specific example of this change is exemplified in FIG. 3B. A peak interval of the transmitted light is called Free Spectral Range (its abbreviation is FSR) as described above, and expressed in said equation (6) and (7). Transmitted light 107 obtained in this manner is received by a light detector 109 and then is converted into a photocurrent. On the other hand, the reflected light 116 of the light-path splitter 104 is received by a light detector 115 and then is converted into a photocurrent.

As a desired wavelength-error detecting signal, as described above, an error signal A(λ) is generated by a difference between a photocurrent passing through the light detector 115 for monitoring a light output and a photocurrent passing through the light detector 109 for monitoring a wavelength that is placed behind the etalon 106.

The error signal A(λ) is expressed in the following equation:

$$A(\lambda)=Pt-Pm \qquad (9)$$

In this connection, the following signal, which is normalized by light quantity, can also be used as an error signal:

$$A(\lambda)=(Pt-Pm)/(Pt+Pm) \qquad (10)$$

In this case, intensity of light, which is transmitted through the etalon, can be expressed in the equation (1) as described above.

FIG. 6 illustrates the equation (9). In FIG. 6, a horizontal axis is wavelength difference (nm), and a vertical axis is error signal (arbitrary unit). Etalon's reflectivity R is used as a parameter for each curve. In other words, this is a specific example when the etalon's reflectivities are 27, 35, 50, and 65%. However, in any of the reflectivities, an error signal has a periodical peak in characteristics in response to wavelength difference.

Here, as described above, a ratio of a half-width of the etalon's transmission peak ε to FSR is called finesse Φ. There is the following relations between the finesse Φ and the etalon's reflectivity R:

$$F=4R/(1-R)^2 \qquad (2)$$

$$\Phi=(\pi\sqrt{F})/2 \qquad (5)$$

$$\Phi=FSR/\epsilon \qquad (8)$$

Therefore, in order to obtain a sharp spectral characteristics ε of the etalon, it is required that reflectivities of both surfaces of the etalon is high, and that reflections on both surfaces are caused many times repeatedly. For this purpose, an angle of incident light to the etalon is required to be in close proximity to vertical. If the incident angle is not vertical, each reflection of reflected light causes a shift. As a result, interference occurs only in a portion of a wavefront, which reduces an effective finesse. As this incident angle, an angle within about 5 degrees is used for practical.

In this connection, surface reflectivity of the etalon is set taking a relation between implementation accuracy of the etalon and a ratio of a change in reflectivity into consideration. As it is found out from a diagram showing an example of characteristics, the higher the surface reflectivity becomes, the larger a difference signal becomes in response to a change in wavelength.

In addition, because it is required to take reflected light from the etalon to introduce it into a light detector, the light-path splitter 104 is basically necessary. This is an important point of the present invention.

Wavelength control using the wavelength error signal having high sensitivity, which has been obtained in this manner, is performed as below.

FIG. 10 shows an example of a specific configuration for controlling an emitting wavelength of a light source. In this connection, in FIG. 10, various kinds of members for detecting a lasing-wavelength shift of the light source described above are omitted. Only an etalon 106, and two light detector 109, 115 are simply illustrated. Moreover, a configuration of information exchange side is also omitted in FIG. 10. By the way, L exemplifies a collimator. It may be understood that specific configuration of a laser-light wavelength control module according to the present invention is configured by FIG. 9 and FIG. 10 in combination. Additionally, regarding APC (Automatic Power Control) for keeping a semiconductor-laser output constant, a general method is used. To be more specific, by this method, an output of the light detector 115 is compared with a given fixed value, and a result of the comparison is supplied to a driving-current control circuit 404 of a semiconductor laser 100 as feedback.

A parallel plane wave obtained from the laser light source 100 is introduced into the light-path splitter 104, and reflected light is received by the light detector 115. Transmitted light 104 is multiple-reflected off the etalon 106, and passes through the etalon 106. Then, the transmitted light 104 having light quantity, which is determined by the equation (1) in response to a change in wavelength, reaches the light detector 109. A wavelength error signal is a difference between an output of the light detector 115 and an output of the light detector 109, which is determined by the equation (9) or (10) described above. A wavelength of the laser light source 100 is controlled so that the error signal value $A(\lambda)$ becomes zero or a constant value. As a specific method of this wavelength control, a given signal based on the error signal value is supplied to a driving circuit 402 of said temperature control element 401 as feedback according to the purpose described above. In this connection, a signal, which has been generated by the light detector 115 by detecting reflected light 104, is returned to the driving means 404 of the laser light source as feedback, and thereby emission intensity of laser is controlled as usual.

When the error signal is not zero or a given value but a positive value, temperature of the temperature control element is increased. As the temperature increases, an emitting wavelength of the laser device also increases. An example of a relation between this temperature and the emitting wavelength of the laser is shown in FIG. 4. As the emitting wavelength increases, the error signal decreases. Then, the wavelength is fixed to a value at which this error signal reaches zero or a given value. When the error signal is a negative value, temperature of the temperature control element is decreased. Then, using a change opposite to the temperature increase described above, the wavelength is fixed to a value at which this error signal reaches zero or a given value. Concerning such electrical-signal processing system, a general method is sufficient. As another embodiment according to the present invention, a difference between reflected light and transmitted light from the etalon 106 can also be used as an error signal.

Figure 11:
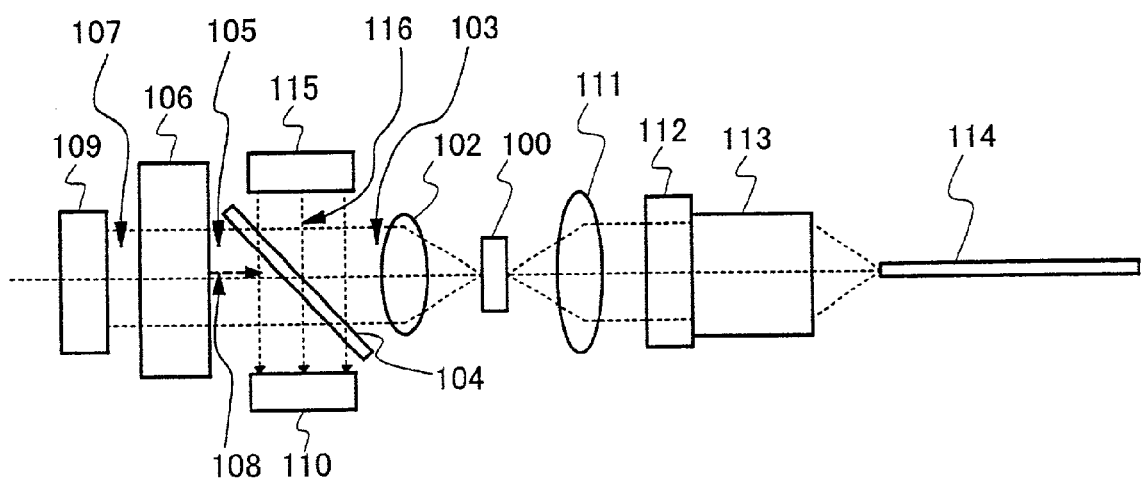
FIG. 11 is a configuration diagram illustrating another example of a wavelength-control light source according to the present invention.

FIG. 11 shows an example like this. A beam splitter 104 is located so that a light detector 110 can detect reflected light 108 from an etalon 106. Others are configured basically in the same manner as the example shown in FIG. 9. Therefore, detailed description is omitted. In FIG. 11, the same members as those shown in FIG. 9 are provided with the same reference numbers.

Figure 12:
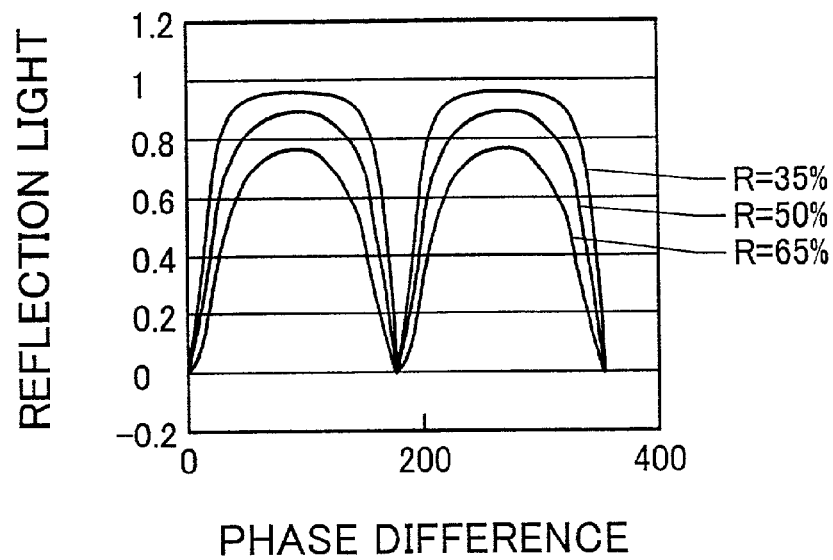
FIG. 12 is a diagram illustrating an example of relations between a phase difference and reflection light regarding an etalon.

As shown in FIG. 12, the reflected light 108 from the etalon 106 is complementary to transmitted light 107, and decreases or increases as the transmitted light increases or decreases. An error signal corresponding to a wavelength shift can be obtained from a difference between transmitted-light current obtained from a light detector 109 and reflected-light current obtained from the light detector 110.

FIG. 12 is a diagram illustrating a relation between reflected light and a phase difference regarding the etalon. A horizontal axis is a phase difference, and a vertical axis is intensity of reflected light (arbitrary unit). The phase difference is the same as that described in FIG. 3(b). Reflection-film reflectivity of the etalon is used as a parameter.

Figure 13:
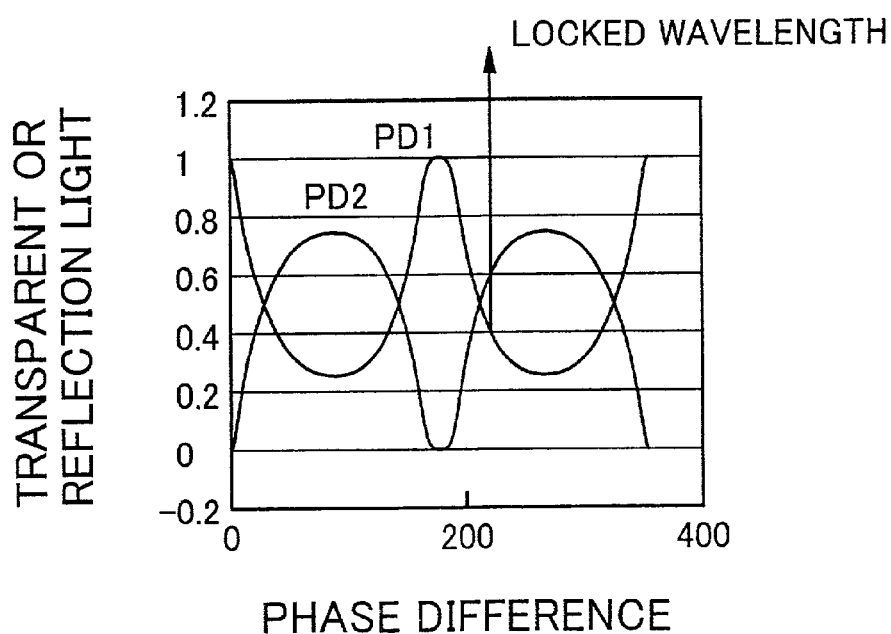
FIG. 13 is a diagram illustrating an example of relations among phase difference, reflection light, and transmission light regarding an etalon.

FIG. 13 is a diagram illustrating a relation between transmitted light and reflected light on the one hand and a phase difference on the other hand when reflectivity of the etalon is 35%. In FIG. 13, a transmitted-light signal is expressed as PD1, and a reflected-light signal is expressed as PD2. A wavelength to be locked is shown by an arrow in FIG. 13. Determining a difference between the transmitted-light signal PD1 and the reflected-light signal PD2 enables us to find out a shift of this maximum wavelength from the locking wavelength more clearly. As shown in this example, when associating an emitting wavelength of the laser light source with the light transmission portion provided by a wavelength selection means, it is equated to an emitting wavelength corresponding to a desired wavelength that is shifted to the highest transmittance wavelength portion in this transmission portion. As shown in this example, the locking wavelength is set to a portion where a gradient of characteristics curve is slightly steeper than that of a peak wavelength in relation to transmission characteristics or reflection characteristics. Setting the locking wavelength to the portion like this provides more accurate wavelength control.

In this embodiment, feedback on operation temperature is given to the laser light source 100 so that an error signal's value corresponding to the wavelength shift is kept constant to close a control loop. This method permits the error signal corresponding to wavelength fluctuation to become double as compared with the first embodiment. In addition, as is the case with the preceding example, in an optical-fiber communication method using an optical-fiber communication module, it is required to keep an optical-fiber output of the optical-fiber communication module constant. For this reason, an optical output from the laser light source 101 should be monitored for the purpose of supplying its feedback to a driving power supply.

One example of this method is, for example, that photocurrent obtained by introducing reflected light from a light-path splitter 104 into a light detector 115 is used for output monitoring as shown in FIG. 11. The optical output of the laser light source is controlled in response to this monitored photocurrent signal, while allowing for a predetermined value. This method uses the same optical-output control method as that of a general semiconductor laser device. Moreover, as another optical-output control method, each of photocurrent from the light detector 109 and the light detector 110 or a sum of the photocurrents can also be used for output monitoring. Originally, those photocurrents are generated by dividing light from the laser light source simply. Therefore, as a matter of course, this method can be applied to the photocurrents.

Figure 14:
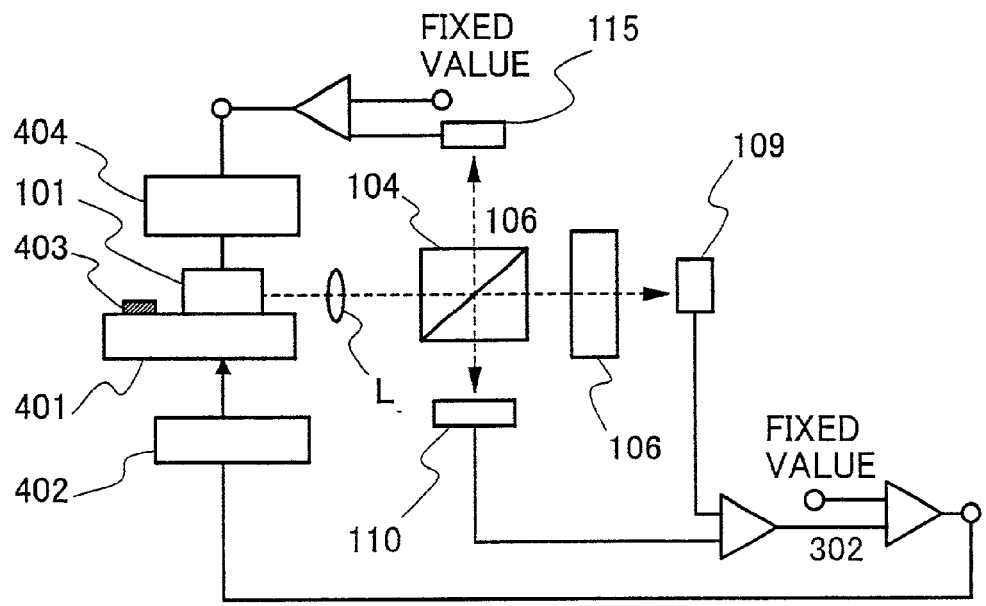
FIG. 14 is a configuration diagram illustrating another example of a wavelength-control light source according to the present invention.

FIG. 14 is a diagram illustrating another control system. In FIG. 14, the same members as those shown in FIG. 10 are provided with the same reference numbers. Therefore, detailed description is omitted. In this example, the wavelength-control optical system shown in FIG. 11, for example, the light-path dividing means 104, the etalon 106, and the light detector 109, 110 are located in relation to the laser light source 101. Transmitted light from the etalon 106 is detected by the light detector 109, and reflected light from the etalon 106 is detected by the light detector 110. As a result, an error signal 302 is obtained. This error signal is based on a predetermined fixed value, and is supplied to the driving circuit 402 of the temperature control means 401 of the laser light source 101. A method for controlling and fixing an emitting wavelength of the laser light source according to this error signal is similar to that described above.

Figure 15:
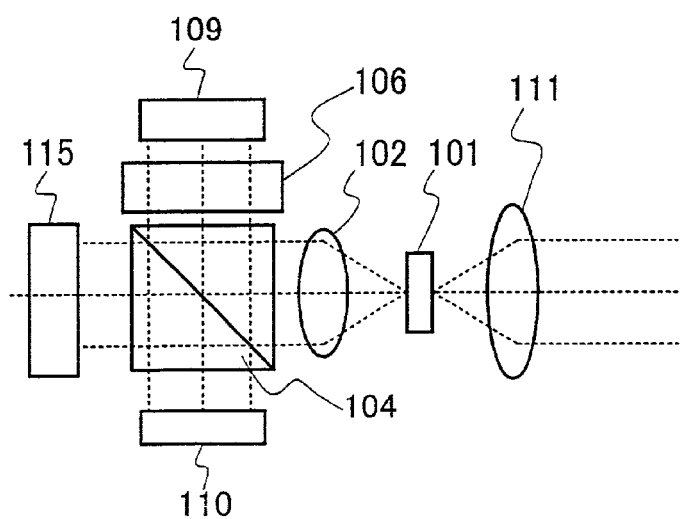
FIG. 15 is a diagram illustrating another example of placement of a wavelength-locking optical system according to the present invention.

FIG. 15 shows another configuration example of the optical system for wavelength locking according to the present invention. Here, only the optical system for wavelength locking is shown. In this example, as opposed to the configuration shown in FIG. 5, transmitted light from the beam splitter 104 is used for an optical output monitoring 115. In addition, reflected light from the beam splitter 104 is introduced into the etalon 106, and its transmitted light is received by the light detector 109. A wavelength error signal is a difference between photocurrents passing through the light detector 109 and the light detector 115. As another method, reflected light from the etalon 106 pass through the beam splitter 104, and is received by the light detector 110; a difference between photocurrents passing through the light detectors 109 and 110 is used as a wavelength error signal. A circuit loop of electrical control-signal processing is the same as those described in FIG. 10 and FIG. 14. In FIG. 15, reference numbers 102 and 111 are collimators.

Figure 16:
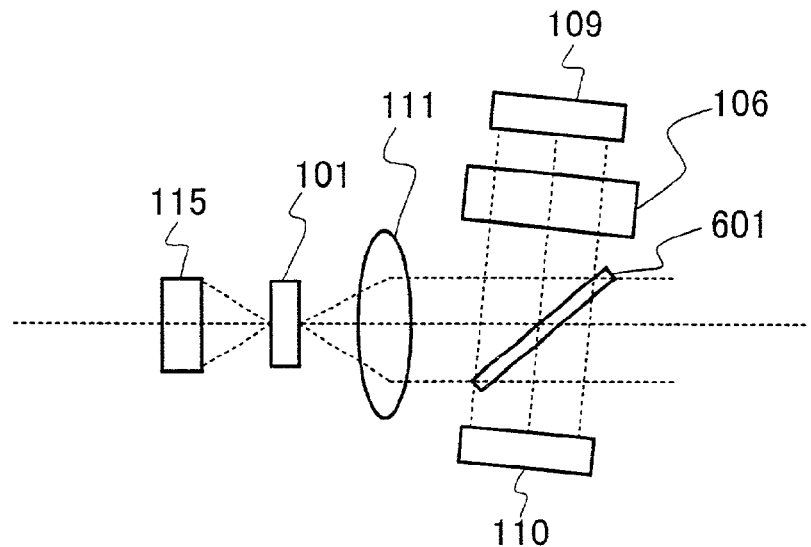
FIG. 16 is a diagram illustrating another example of placement of a wavelength-locking optical system according to the present invention.

FIG. 16 shows another configuration example of the optical system for wavelength locking according to the present invention. Here, only the optical system for wavelength locking is shown. A portion of parallel light, which has been collimated by a collimator ahead of the laser light source 101 (for example, a collimator lens 111), is reflected by a beam splitter 601 and introduced into the etalon 106. After that, its transmitted light is received by the light detector 109. Reflected light from the etalon 106 passes through the beam splitter 601, and then is received by the light detector 110. As optical output monitoring, the light detector 115 placed behind the laser light source 101 can be used. A loop of electrical control-signal processing similar to that described in FIG. 10 or FIG. 14 can be used.

Figure 18:
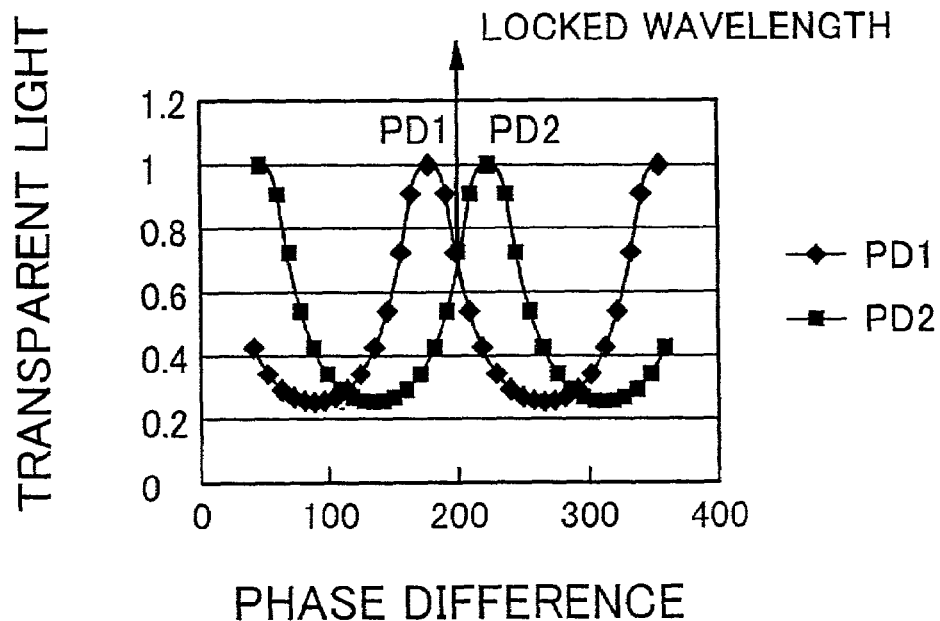
FIG. 18 is a diagram illustrating an example of relations between phase difference and transmission light regarding an etalon.

FIG. 17 shows another embodiment of the optical system for wavelength locking according to the present invention. To be more specific, light emitted from behind the laser light source 101 is collimated using a collimator lens to form a parallel plane wave. In its light path, an etalon 701 is placed. Duplexed light detectors 702 and 703, which are placed in close proximity to each other, are located immediately after the etalon 701. In this case, light arriving at the light detector 702 differs from light arriving at the light detector 703 in a position where each light passes through the etalon 701. In addition, because the etalon 701 has a taper, there arises a shift in a peak position in response to a change in wavelength of each transmitted light. Therefore, a wavelength error signal as shown in FIG. 18 is obtained from a difference between photocurrents from the light detectors 702 and 703. In other words, FIG. 18 shows a relation between a phase difference and intensity of transmitted light. A horizontal axis is a phase difference, and a vertical axis is intensity of transmitted light. A curve shown as PD1 is an output from the light detector 702 that detects light transmitted through a thin-film portion of the etalon 701. A curve shown as PD2 is an output from the light detector 703 that detects light transmitted through a thick-film portion of the etalon 701. As an output monitoring, a sum of the photocurrents PD1 and PD2 from the light detectors 702 and 703, or a photocurrent from the light detector 115 that receives light ahead of the laser light source 101 can be used. As a loop of electrical control-signal processing, a loop similar to that described in FIG. 14 can be used.

Figure 19:
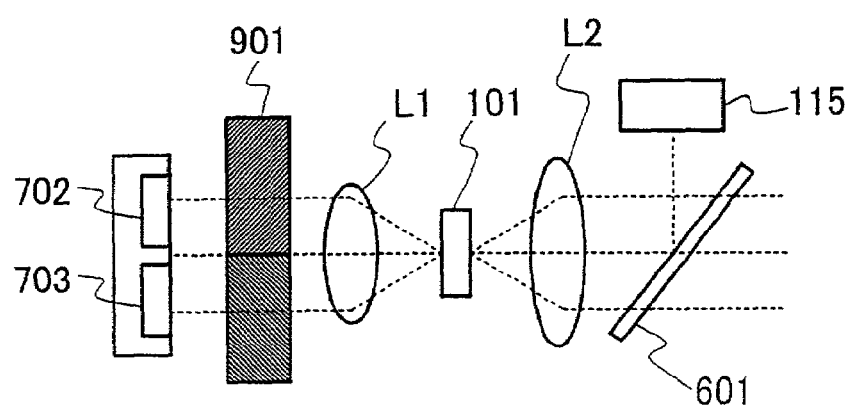
FIG. 19 is a diagram illustrating another example of placement of a wavelength-locking optical system according to the present invention.

FIG. 19 shows another embodiment according to the present invention. In this example, an etalon comprises two portions 901 and 902 having different transmission characteristics each other. Light arriving at the light detector 702 differs from light arriving at the light detector 703 in light-path length at the position where each light passes through the etalon. A difference between the light-path lengths can be obtained by changing a refractive index or a mechanical length of the etalon slightly. If the etalon like this is used, an operation principle of wavelength locking is basically similar to that described in FIG. 14. By the way, in FIG. 19, a reference number 601 is a light-path dividing means, and 115 is a light detector. This system provides light output control of the laser.

As described above, it is desirable that an emitting wavelength of a semiconductor laser is variable to permit it to be matched with channels of Wavelength Division Multiplexing optical-fiber communication (that is to say, ITU-TS grid intervals including 100, 50, and 25 GHz).

In response to this requirement, in the present invention, FRS of the etalon is matched with channels of Wavelength Division Multiplexing optical-fiber communication (that is to say, ITU-TS grid intervals including 100, 50, and 25 GHz). To be more specific, a transmission-peak interval of the etalon is matched with the ITU-TS grid. Additionally, a wavelength of the laser light source is locked at an arbitrary wavelength on the grid. For example, if a solid etalon using fused quartz having a refractive index n (about 1.4) as its material is used, a thickness t is calculated by the equation (7) described above. A change in wavelength of the laser light source is, for example, practically controlled by changing a laser temperature using a temperature-variable element such as a Peltier cooler as a means. An example of a relation between a lasing wavelength and temperature at the time of laser lasing is similar to that shown in FIG. 4 described above.

Figure 20:
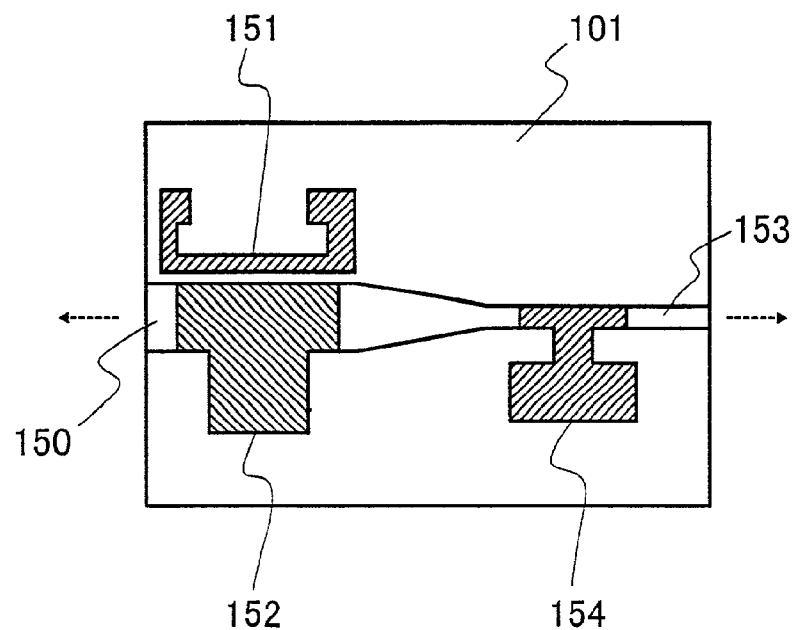
FIG. 20 is a plan view illustrating an example of a wavelength-variable semiconductor laser device.

Next, another example of a laser device characterized by a variable lasing-wavelength is exemplified. FIG. 20 shows a schematic plane configuration of the exemplified laser device like this. In this example, there is a wavelength-variable laser light source 100. Its temperature is changed by a film heater 151 that is integrated in proximity to a DFB laser portion 150. The change in temperature causes a refractive index and a bandgap to be changed, which permits an emitting wavelength of laser to be variable. Using such wavelength-variable light source in combination with a wavelength locking method according to the present invention provides us with a effect as follows. To be more specific, when changing a temperature of the laser light source so that lasing is performed at an arbitrary wavelength of ITU-TS grid, only a portion in proximity to a laser activation layer is locally changed in temperature while a temperature of the etalon placed at a position sufficiently far from the layer is little changed. That is because of temperature characteristics of the etalon. When a transmission peak is shifted, a different operation temperature causes a shift from ITU-TS grid. However, if a structure capable of changing only a semiconductor laser's temperature locally is provided like this example, it is not necessary to be concerned about temperature characteristics of the etalon.

Supplemental description of the wavelength-variable semiconductor laser device is given as bellow. As described above, FIG. 20 shows a plane configuration view including main components of the wavelength-variable semiconductor laser device. On a semiconductor substrate surface 101, a semiconductor-laser luminous portion 150 is located. A temperature-variable means 151 is located in proximity to the semiconductor-laser luminous portion 150. Facing to face with the semiconductor-laser luminous portion 150, a light modulator 153 is located. This light modulator 153 is controlled by an electrode 154. Generally, light on this modulator side is used for information communication.

A basic configuration of such wavelength-variable semiconductor laser device is a combination of a wavelength-variable light source (or an integrated multiple-wavelength light source) and the light modulator. As an optically combined form of them, it is possible to use any of the following forms: a form that configures each of them separately (Hybrid integration); and a form that integrates them monolithically (monolithic integration). In the device like this, a portion of output light from the wavelength-variable light source or the integrated multiple-wavelength light source is introduced into the light modulator, which generates a light signal by its on/off operation.

The laser module according to the present invention is devised to fix an emitting wavelength of laser. However, practically, when fixing a wavelength of the semiconductor laser device having a light modulator, characteristics of the light modulator is also required to be adjusted corresponding to a slight change in wavelength.

For the purpose of addressing this problem, the following is taken into consideration: a means for controlling a light modulator's temperature locally is provided in proximity of the light modulator. This temperature-control means controls a temperature of an active waveguide layer of the light modulator to a desired value. Such basic form enables the following: controlling a wavelength of the light source; providing a light-modulation means that corresponds to high-speed light modulation; and controlling chirping characteristics of a light modulator portion; and the like.

A first example of specific operation is: in response to fluctuations in a wavelength of a light signal introduced into a light modulator, a bandgap wavelength of the light modulator is fluctuated to the same extent as the fluctuations. If a more specific embodiment is exemplified, this temperature-control means comprises at least a means for detecting a wavelength of light incident to a light modulator, and a means for adjusting an operation temperature of the light modulator according to the detected wavelength. Practically, in addition to them, this temperature-control means further comprises a means for adjusting an operation current of the semiconductor-laser element portion according to the detected wavelength. Said means for adjusting an operation temperature of the light modulator is: in response to fluctuations in wavelength of a light signal introduced into the light modulator, a bandgap wavelength of the light modulator is fluctuated to the same extent as the fluctuations. For example, when an optical signal introduced into the light modulator becomes long, a bandgap wavelength of the light modulator is also changed to be longer to the same extent as the optical signal. Adjusting the operation current of the semiconductor-laser element portion permits slight fluctuations in lasing power according to the wavelength fluctuations to be adjusted. In this manner, it is possible to ensure high-speed light modulation that corresponds to wavelength control of a light source.

A more specific embodiment of a laser module comprising such wavelength-variable semiconductor-laser device is described later.

Figure 21:
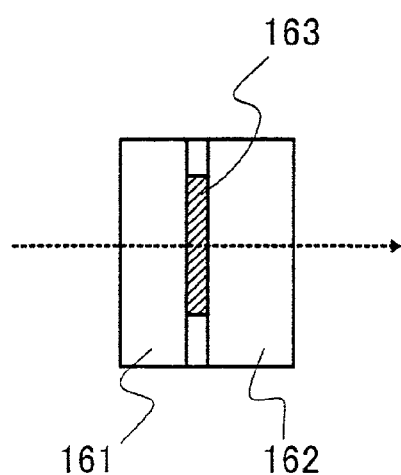
FIG. 21 is a sectional view illustrating an example of an etalon of which temperature coefficient is zero.

Next, a configuration of an etalon, of which a temperature coefficient is made zero, is exemplified as below. FIG. 21 is a sectional view illustrating an example of such etalon. This example shows a method for constructing an etalon, of which a temperature coefficient (a product of refractive index n and length t) becomes zero effectively, by connecting together two or more materials characterized in that a temperature coefficient for one material reverses in sign as compared with the other. To be more specific, assuming that a refractive index of glass substrates 161 and 162 is n1, a sum of lengths of the glass substrates 161 and 162 is t1, a refractive index of another material is n2, and its length is t2, materials of the etalon are selected so that a differential coefficient under temperature T becomes zero: that is to say, $d(n_1 t_1 + n_2 t_2)/dT = 0$ ... (11). For example, regarding silicon gel 163, because a temperature coefficient of a light-path length is negative, combined use with a general glass can satisfy the equation (11).

If a variable laser-wavelength is provided by means of the method explained in FIG. 4, a temperature of the laser is changed in accordance with a temperature of the etalon because the laser and the etalon are located on the same Peltier cooler. On the other hand, a transmission peak of the etalon expressed in the equations (1), (2), and (3) is determined by a product of mechanical length t and refractive index n of the etalon, that is, a light-path length. However, the refractive index n depends on temperature, and the mechanical length t is changed by thermal expansion. As a result, a transmission peak wavelength has a temperature coefficient. Even if FSR is matched with a grid interval, operation of the etalon in a different temperature causes a shift from the ITU-TS grid 160. This embodiment provides a means for solving this problem.

Figure 22:
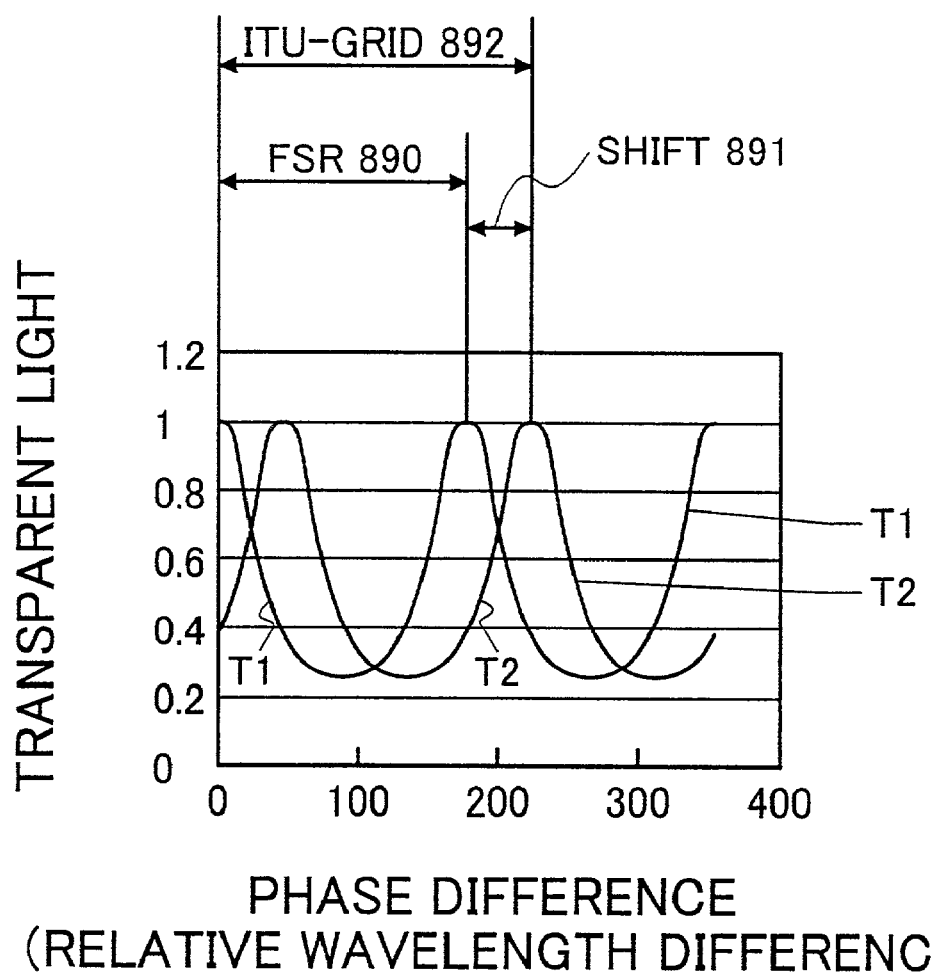
FIG. 22 is a diagram illustrating a relation between a wavelength-variable method according to the present invention and ITU-TS grid.

FIG. 22 is a diagram illustrating another means for solving the problem of the shift described above. A horizontal axis is a phase difference (a relative wavelength difference), and a vertical axis is intensity of transmitted light (an arbitrary unit). What curves T1 and T2 mean are similar to those exemplified in FIG. 18.

A method of this example is described as below. To be more specific, as shown in the equation (7), a thickness of the etalon is generally determined so that a free spectral range of a Fabry Perot etalon is matched with a channel grid interval of a Wavelength Division Multiplexing optical-fiber communication. However, in this example, a thick etalon is provided to give a narrow free spectral range beforehand like a phase-difference range 890 shown in FIG. 22. At this point, when increasing a temperature of a laser's temperature control element to operate at the next grid wavelength, thermal characteristics of the etalon causes a transmission peak to be shifted to the long wavelength side. A thickness of the etalon is increased so that this shifted quantity 891 becomes equal to a difference between the narrowed FSR890 and the grid interval 892. Thus, the shift due to the etalon's temperature characteristics can be compensated. In this connection, signals of T1 and T2 are similar to those shown in FIG. 18.

Figure 23:
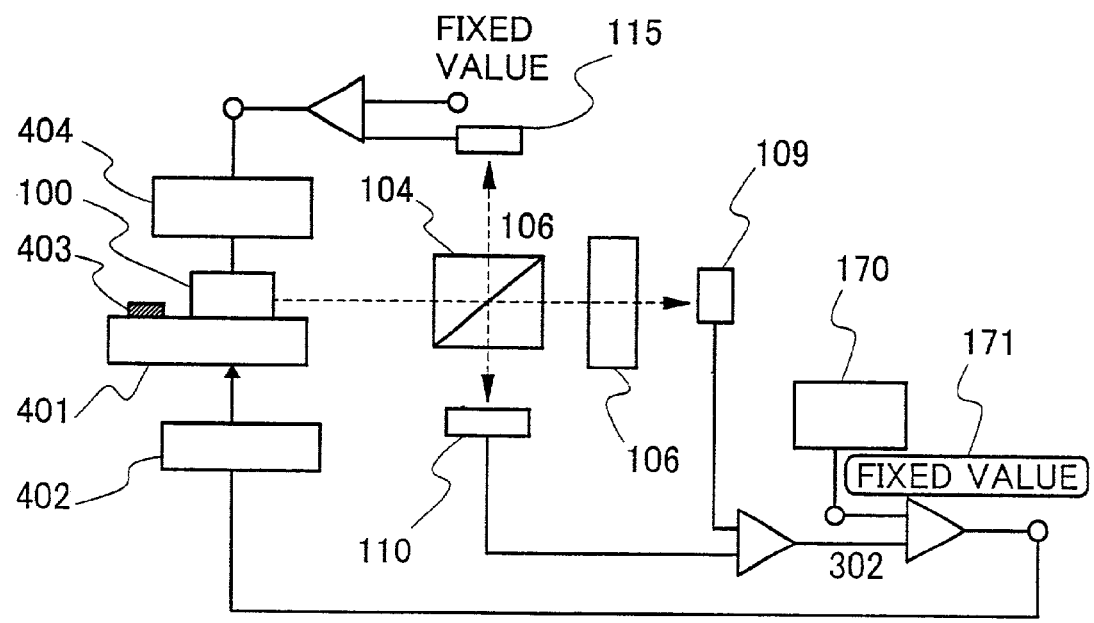
FIG. 23 is a diagram illustrating another example of placement of a wavelength-locking optical system according to the present invention.

FIG. 23 shows a method for configuring a device that compensates an error based on a temperature coefficient of the etalon. In other words, this is a method used in a case where the temperature coefficient of the etalon cannot be neglected and causes a shift of a laser's lasing wavelength from an ITU-TS grid.

FIG. 23 is similar in basic configuration to FIG. 14. Accordingly, members similar to those shown in FIG. 14 are provided with the same reference numbers. A temperature of a semiconductor laser device 100 is generally controlled by a Peltier cooler 401. To be more specific, an operation temperature of the laser light source 100 is compensated to control the Peltier cooler 401 by a driving circuit 402. In this manner, an emitting wavelength of the semiconductor laser device is controlled.

In this example, a temperature detecting means 403 (for example, a thermistor) is provided in proximity to this semiconductor laser device 100. In addition, an information storing means 170 (for example, a semiconductor storing device) is located in the optical-fiber communication equipment. In this information storing means 170, temperature characteristics of an etalon's transmission peak wavelength and a relation between wavelength and temperature of a laser light source, which have been measured beforehand, are stored. As is the case with the examples of the present invention described above, an error signal 302 based on outputs from two light detecting means 109 and 110 is obtained. As it is found out in this example, allowing for the stored temperature characteristics of the etalon's transmission peak wavelength and the stored relation between wavelength and temperature of the laser light source, a value to be compensated for this error signal is obtained. After that, based on this result, a feedback signal of a fixed value 171 corresponding to a desired lasing wavelength is determined to close a control loop of a wavelength control system. Thus, fluctuations in transmission characteristics based on the etalon's temperature characteristics are compensated, and a signal for controlling an emitting wavelength based on original transmission characteristics of the etalon can be obtained. Members other than those associated with the artifice in this example are the same as those shown in FIG. 14. Moreover, a method for adjusting an emitting wavelength of the laser device according to an error signal or a feedback signal to fix the emitting wavelength is the same as that described above.

Figure 24:
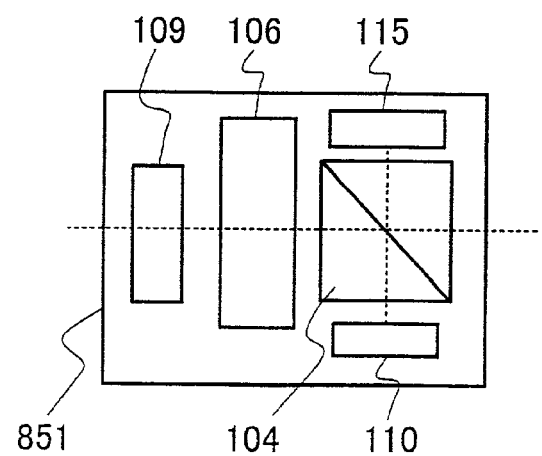
FIG. 24 is a plan view illustrating an example of a wavelength control module's subassembly according to the present invention.
Figure 25:
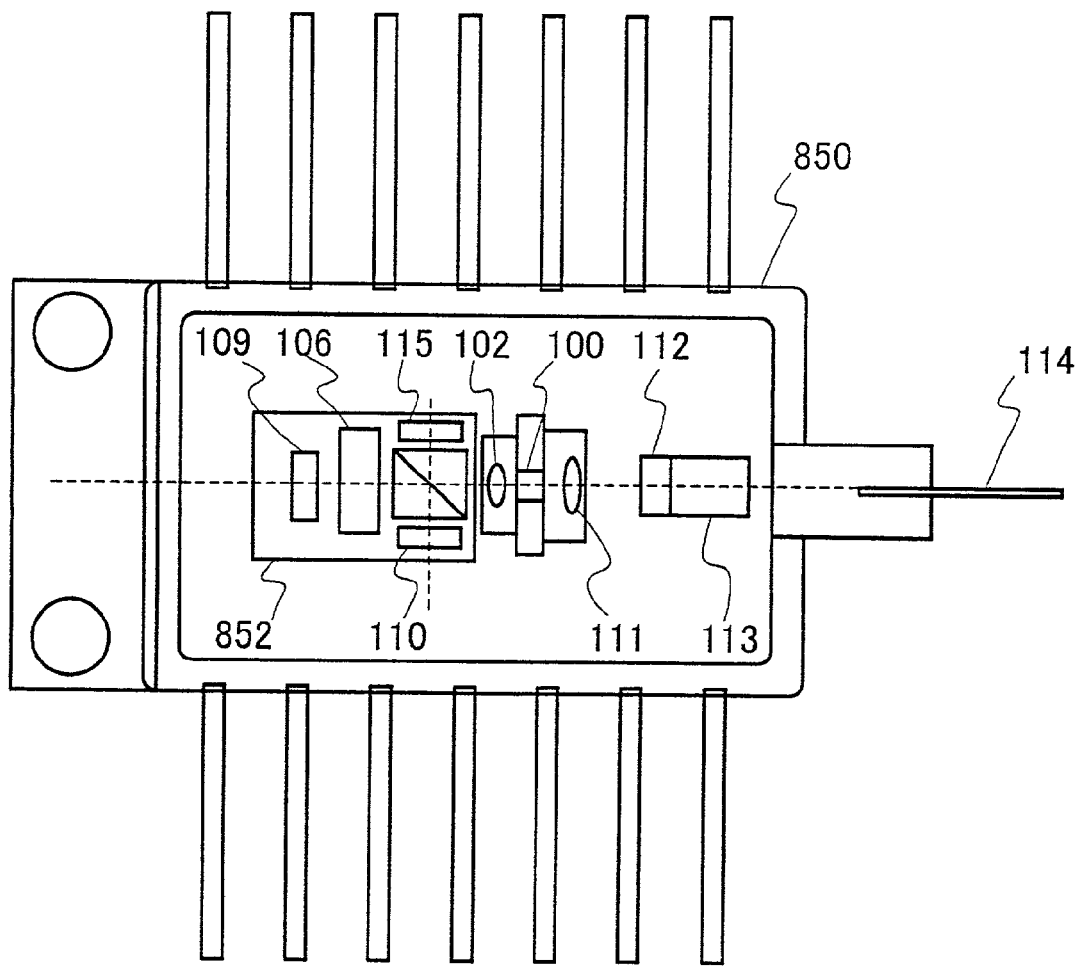
FIG. 25 is a plan view illustrating an implementation example of a wavelength control module according to the present invention.

Next, concerning a method for implementing the laser module according to the present invention, an example is shown in FIG. 24 and FIG. 25. FIG. 24 is a plan view illustrating a subassembly in which members of each optical system and an etalon are equipped on a substrate. FIG. 25 is a plan view illustrating a condition of a 14-pin butterfly-type communication module package 850, on which desired members of a wavelength-locking optical system including this subassembly are placed. As shown in FIG. 25, said subassembly 851 is located facing to face with one edge of a wavelength-variable laser light source 100, and an optical-fiber communication line, for example, an optical fiber 114 as its typical example is located on the other edge. In this example, a collimator element 102 (for example, a collimator lens) is located between the laser light source 100 and the subassembly 851; and a collimator element 111 (for example, a collimator lens), an optical isolator 112, and a condensing means 113 (for example, a condenser lens)) is located between the laser light source 100 and the optical fiber 114.

In this example, as shown in FIG. 24, an etalon 106, a beam splitter 104, and light detectors 109, 110, 115 are placed on the substrate 851. The substrate 851 is placed in a light path of a parallel optical system lasing at a desired wavelength, which has been prepared in another place beforehand, and then an incident angle of light to the etalon is adjusted and fixed to make a subassembly. After that, the subassembly is placed in a light path of a parallel optical system lasing at a desired wavelength, which has been prepared in the package 850. This incident angle to the etalon is equivalent to the incident angle explained in the general description of the etalon. This method provides an advantage of implementation resulting from using parallel plane waves according to the present invention. It is also possible to use the following method: mounting members other than an etalon on a module package; and after that, mounting the etalon on the module package.

This example has an advantage of implementation that it is easy to build optical-fiber communication equipment including an etalon into one package.

In other words, integration of the wavelength-locking portion into a subassembly in this manner has an advantage that it is not necessary to make fine adjustment of a distance between the semiconductor laser and the condenser lens because an angle of divergent light arriving at the etalon as incident light is adjusted. Furthermore, it is also not necessary to make fine adjustment of a tilt angle of the etalon while observing an output from duplexed light detectors. The present invention provides the extremely great advantage of implementation like this.

Figure 26:
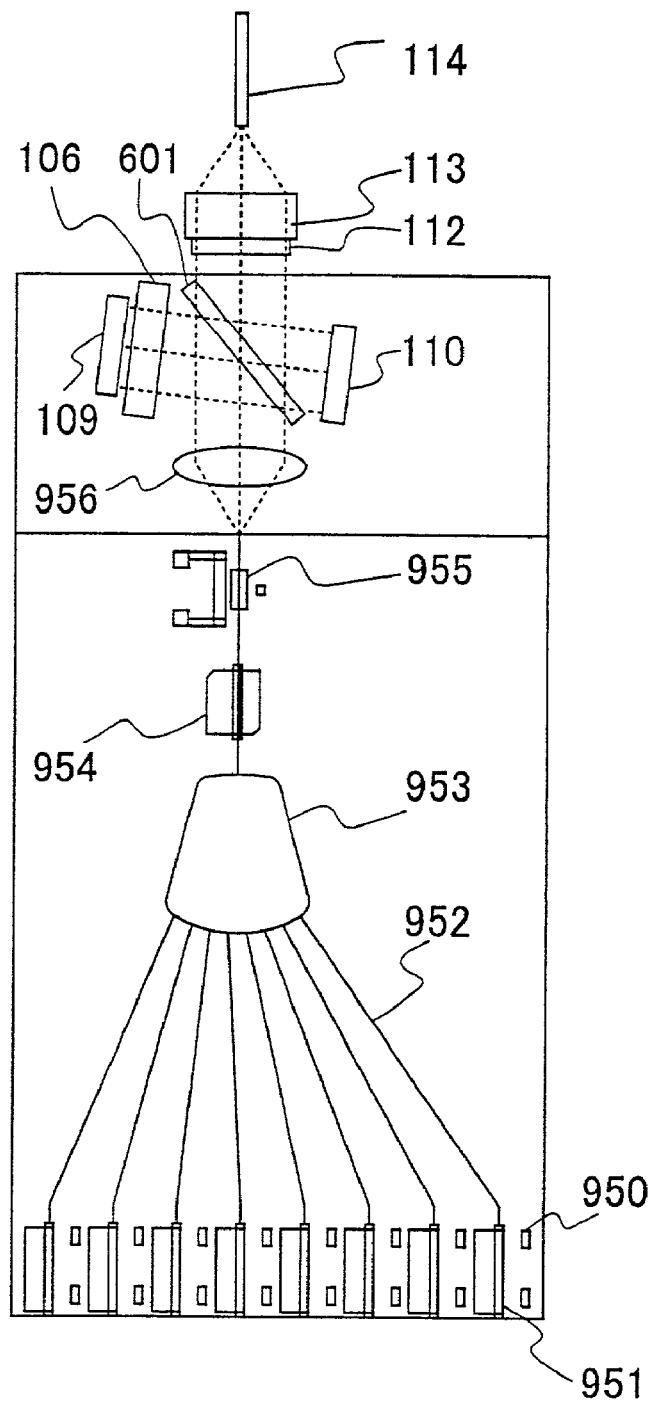
FIG. 26 is a plan view illustrating a configuration example of a wavelength control module according to the present invention.

FIG. 26 shows another embodiment according to the present invention. This is an example showing that a wavelength-variable semiconductor laser device comprising a plurality of luminous portions is used.

To be more specific, a plurality of wavelength-variable light sources 951 similar to that shown in FIG. 20 are placed in parallel. Each emitted light is focused on a waveguide 952. On the wavelength-variable light sources 951, a heater 950 to permit a wavelength to be variable is equipped by means of integration. The focused light is gathered by a wavelength multiplexer and demultiplexer 953, and amplified by a semiconductor optical amplifier 954. After that, the light is modulated by an electric absorption modulator 955, and then is emitted from an end of a waveguide substrate. The emitted light is collimated by the collimator lens 956 as shown in FIG. 11, reflected by the beam splitter 601, and reaches the etalon 106, which constitutes the wavelength-locking optical system described above. Light transmitted through the beam splitter 601 reaches the optical fiber 114 via the isolator 112 and the condenser lens 113. As a result, information is transmitted. In this configuration, as described above, matching FSR of the etalon 106 with the ITU-TS grid, and changing a wavelength of each laser by turns permit an output wavelength of the fiber 114 to be variable throughout a range wider than that in the case of one laser light source. In addition to it, wavelength fixing also becomes possible. Such wavelength-variable light source is useful as a light source for a high-capacity Wavelength Division Multiplexing optical-fiber communication system as a matter of course. It is also useful as a light source for a wavelength-channel changing switch, that is to say, a light source for a router.

Needless to say, as regards an optical system and the like having a configuration like this, which uses a method for locking a wavelength of a laser light source, the various methods described above can be applied to them.

Figure 27:
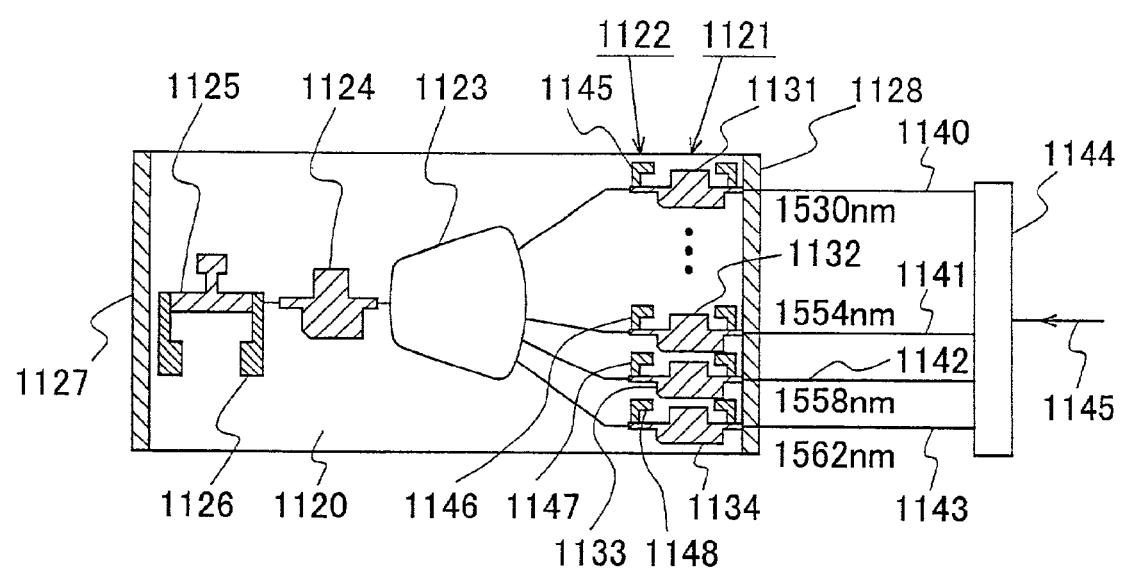
FIG. 27 is a plan view illustrating an example of a wavelength-control semiconductor laser device associated with the present invention.
Figure 28:
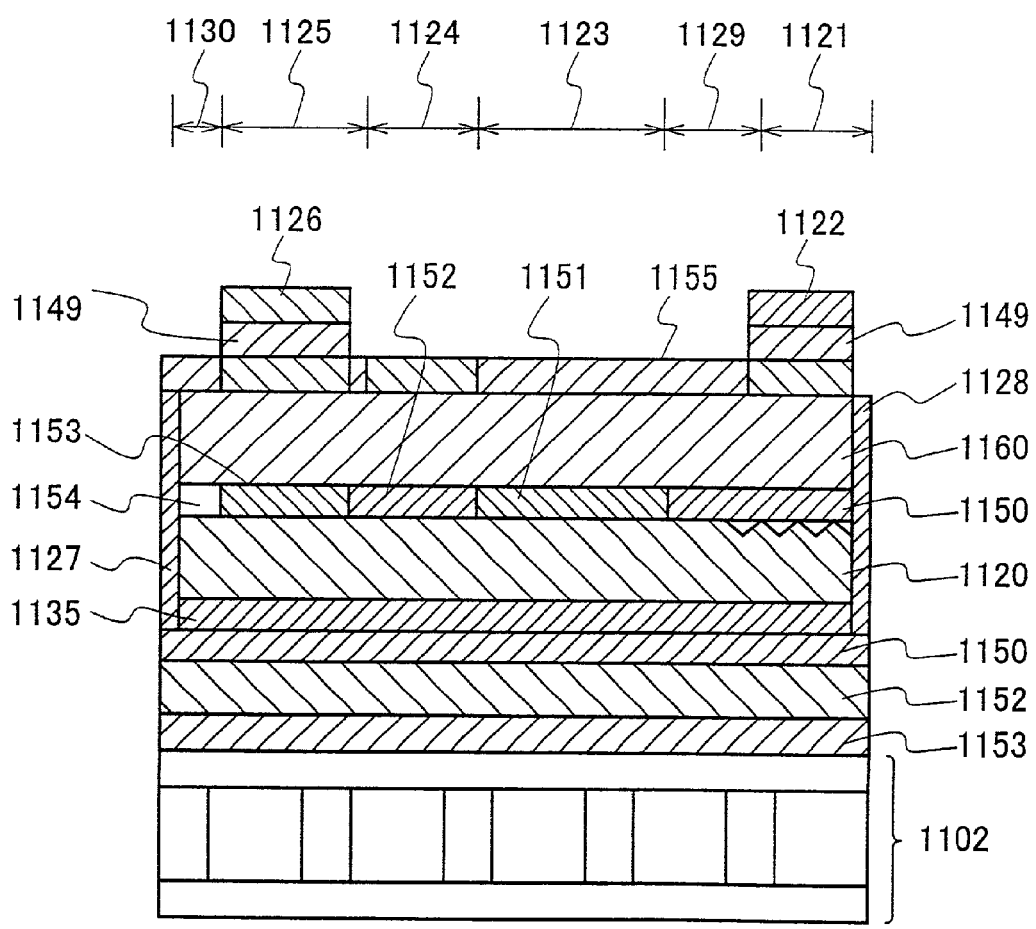
FIG. 28 is a sectional view illustrating an example of a wavelength-control semiconductor laser device associated with the present invention.

Next, a portion of the semiconductor laser device in this example is described in detail. FIG. 27 is a plan view illustrating a wavelength-variable semiconductor laser device similar to said semiconductor optical element portion 106. To be more specific, regarding the wavelength-variable semiconductor laser device in this example, a laser luminous portion 1121 is equipped with a temperature control means 1122. In addition, a light modulator 1125 is also equipped with a temperature control means 1126. Significance of providing the light modulator with the temperature control means is described above. FIG. 28 is its sectional view in a traveling direction of light. In this connection, this sectional view is shown along an optical waveguide. Therefore, it is not a correct sectional view of the device shown in FIG. 27.

The semiconductor optical element portion 1121 is formed by an InP/InGaAsP material or an InP/InGaAlAs material, or by both of them. As a substrate 1120 used for forming the semiconductor optical element portion 1121, InP is used. A laser array portion 1121 is located on one side of the semiconductor optical element portion of this example. The laser array portion 1121 of this example is a multi-wavelength distributed feedback laser array. In this connection, as a laser device, not only DFB type but also DBR (Diffraction Bragg Refraction) type laser device can also be used. Even for DBR type laser device, supplying a feedback signal according to the present invention to a member having a function of controlling a wavelength can also achieve the object. As shown in FIG. 27, in this example, the multi-wavelength distributed feedback laser array portion 1121 comprises a plurality of laser element portions (1131, 1132, 1133, 1134) having a luminous peak in proximity to a wavelength portion from 1530 to 1562 nm. FIG. 27 is a diagram showing that a modulated signal 1145 from outside is selected by a switch 1144, and that the signal is further passed through signal systems 1140 though 1143 to drive each of semiconductor laser elements 1131 through 1134. As regards a signal system to each of heater portion 1122, an input is similarly provided.

Light with each wavelength of the laser array portion 1121 is multiplexed by a light multiplexer 1123. Then, the optical waveguide optically passes the light from the light multiplexer 1123 to the light modulator 1125 via an optical amplifier 1124. The light modulator 1125 in this example is a well-known electric-absorption type semiconductor light modulator. The light is input to the light modulator 1125 after it is optically amplified by the optical amplifier 1124. In addition, an edge of the element on the light modulator side is covered with a low reflection film 1127; and an edge on the laser side is covered with a high reflection film 1128. The light is emitted from this low reflection film 1127 toward outside of the optical semiconductor device. In this example, temperature control means 1122 and 1126 (by the way, these reference numbers are generic names of the means) are placed in proximity to each laser element portion of the laser array portion 1121 and the light modulator 1125. In FIG. 27, each individual temperature control means 1122 corresponding to each laser portion is shown as 1145, 1146, 1147, and 1148 respectively. On the other hand, the temperature control means 1126 is a heater for controlling operation temperature of the light modulator 1125.

FIG. 28 is a sectional view illustrating this example. An optical waveguide 1150, which uses InGaAsP or InGaAlAs as a chemical-compound semiconductor material, is formed on a semiconductor substrate 1120. In this example, a diffraction grating 1151 for a DFB type laser is formed on a surface of the semiconductor substrate InP 1120 beforehand. Forms and production method, which are generally known, may be used for the laser portion 1121, a waveguide portion 1129, the multiplexer portion 1123, the amplifier portion 1124, the light modulator portion 1125, and others. Optical waveguides 1151, 1152, and 1153 corresponds to the multiplexer portion 1123, the amplifier portion 1124, and the light modulator portion 1125 respectively. An InP layer is formed on each of those optical waveguides to make a clad layer 1160 for performing optical waveguide. In this connection, an InP layer having a window structure 154 is provided on a light emission portion side to reduce light absorption as much as possible.

On this layer, electrodes 1121 of the semiconductor laser portion and the light modulator portion are formed. In addition to it, after a silicon dioxide film of an insulating layer 1149 is coated with the layer, the heater portions 1122 and 1126 such as Pt or Ti are further formed on the layer. By the way, on the reverse side of the semiconductor substrate, a n-side electrode 1135 is formed. A reference number 1155 is a passivation film on the surface of the device. The semiconductor optical device prepared in this manner is mounted on a heat sink 1150 and a chip carrier 1152 as it is generally mounted. After that, all of them are further mounted on a temperature controller 1102 coated with an adhesive layer 1153. This temperature controller 1102 is a general Peltier cooler.

Applying a desired current to each of the heater portions 1122 for controlling a laser lasing wavelength (each individual heater is shown as 1131 through 1134 respectively) permits a temperature of each laser element portion to be controlled. As a result, using the functions of selecting a laser channel to be operated and providing a variable wavelength in combination enables us to produce a wavelength ranging from 1530 to 1562 nm, that is to say, continuous wavelengths scanning. To be more specific, it is possible to select a desired laser portion of the semiconductor laser array portion, and at the same time to control an emitting wavelength for example at said intervals of 4 nm to cope with a slight wavelength shift of the laser portion. Accordingly, fine adjustment can be made for the wavelength settings that are specified in the field of Wavelength Division Multiplexing optical-fiber communication systems as described above. When operating this optical element, the heater 1126 for controlling an operation temperature of the modulator is energized in response to an input-light wavelength $\alpha p$. Thus, light modulation in response to an emitting wavelength can be performed.

Figure 29:
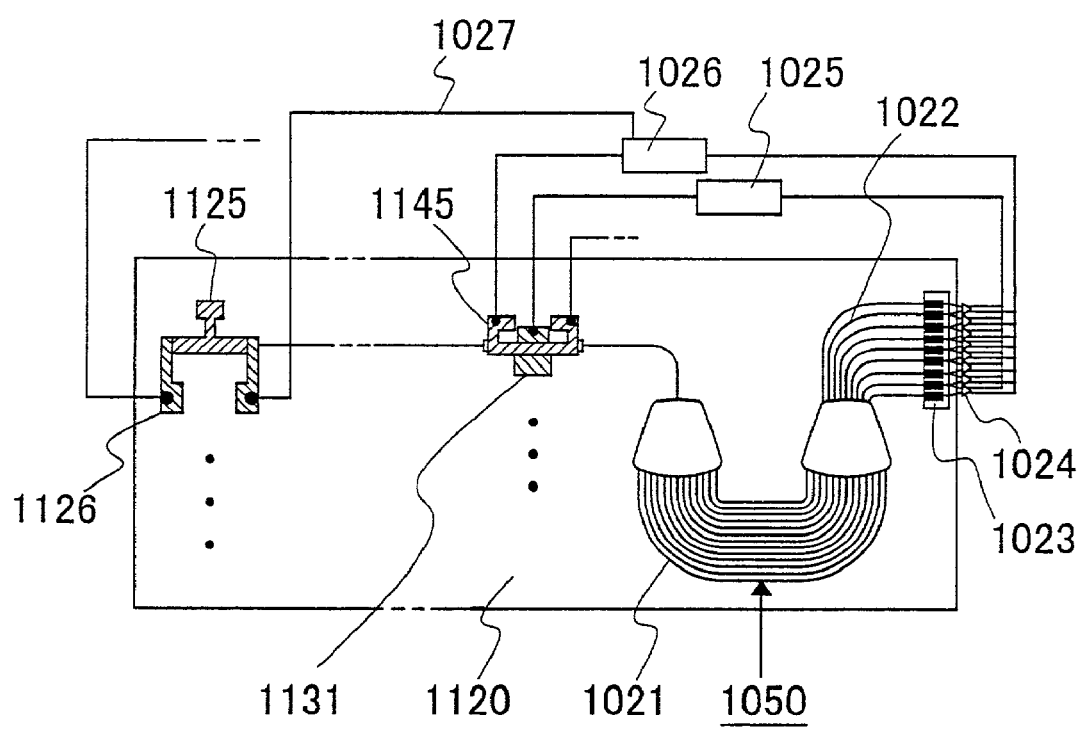
FIG. 29 is a plan view illustrating an example of a control system of a wavelength-control semiconductor laser device associated with the present invention.
Figure 30:
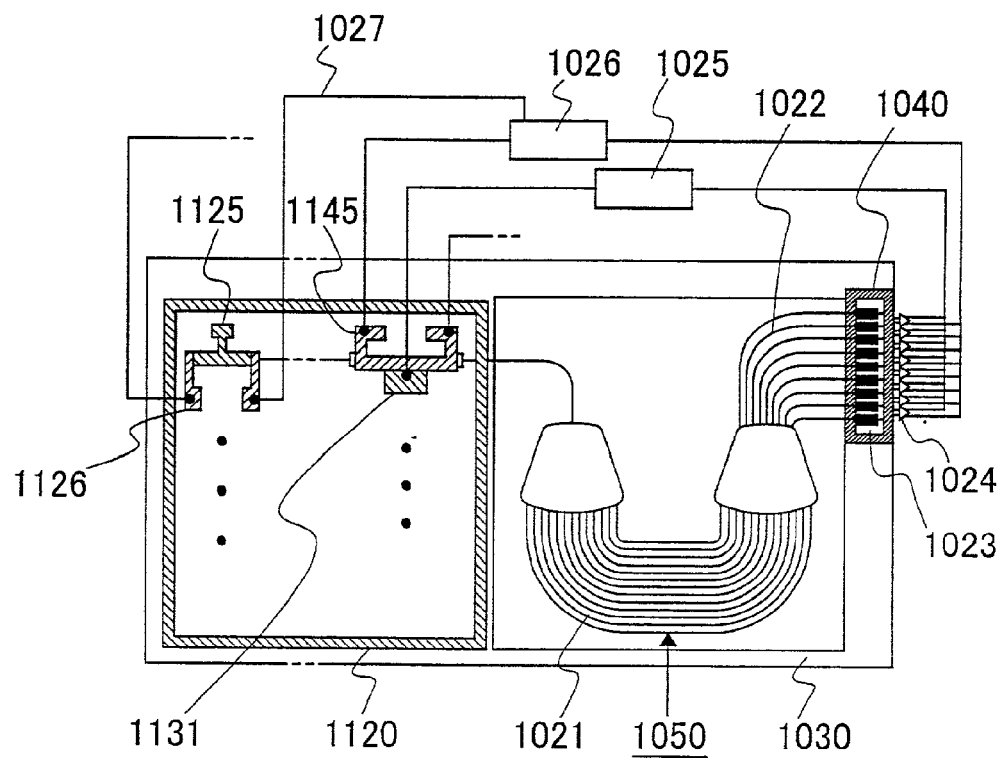
FIG. 30 is a plan view illustrating another example of a control system of a wavelength-control semiconductor laser device associated with the present invention.

FIG. 29 and FIG. 30 are diagrams illustrating the following: a control system for controlling a driving current value of the semiconductor laser element portion and a driving current value of the heater according to an emitting wavelength of the semiconductor laser element portion; and a control system for controlling a driving current value of the light modulator's heater. FIG. 29 illustrates an example showing that its wavelength detecting portion and the optical semiconductor device of this embodiment are monolithically integrated. FIG. 30 illustrates an example showing that the wavelength detecting portion and the optical semiconductor device of this embodiment are integrated in a hybrid method. As shown in FIG. 29, a means 1050 for detecting a wavelength of the semiconductor laser element portion is provided in combination. a laser-wavelength detecting means 1050 is constructed of an array waveguide diffraction grating 1021. This array waveguide diffraction grating 1021 separates and detects light having each wavelength. The light is then introduced into a signal processing portion 1023 via an optical waveguide 1022. A given signal from this logic circuit 1024 is input to an electrode 1131 of each semiconductor laser element, or to a heater 1145 mounted on the semiconductor laser element, via a control system 1025 for controlling a driving current of the semiconductor laser device or a control system 1026 for controlling a temperature of the semiconductor laser element.

In addition, regarding control of the light modulator's heater, a desired signal resulting from detection of fluctuations in wavelength by the semiconductor laser element portion is input to the heater 1126 of the light modulator via a control system 1027 of the light modulator's heater in a similar manner. By the way, in FIG. 29 and FIG. 30, the same reference numbers are used if the same members are used in common. A reference number 1125 is an electrode of the light modulator. FIG. 30 illustrates an example showing that an optical semiconductor device 1120 and a laser wavelength detecting means 1050 associated with this embodiment are integrated in a hybrid manner.

As regard a light modulator in the semiconductor laser device of this example, its temperature is controlled by a temperature controlling means. Moreover, the light modulator is also capable of controlling its temperature in response to a change in lasing wavelength caused by a change in temperature. Thus, it is possible to change optical characteristics of the light modulator in response to a change in temperature of the laser lasing portion to compensate a shift of the characteristics in response to the change in temperature. As a result, desired optical characteristics can be obtained.

Next, as a specific embodiment of an optical system using a laser module according to the present invention, Wavelength Division Multiplexing optical-fiber communication equipment is exemplified. The equipment uses a 1.55 μm wavelength band.

Figure 31:
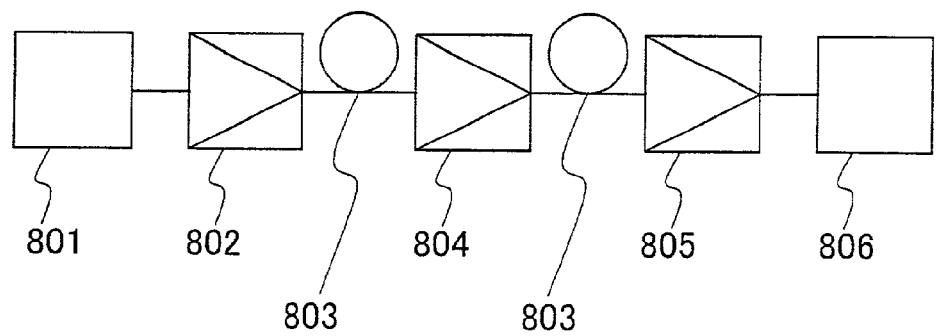
FIG. 31 is a basic configuration diagram illustrating an example of an optical system.

FIG. 31 is a diagram illustrating a configuration of an optical-fiber communication system's main portion. This example shows that an optical transmission light source is configured by a group of light sources having a fixed wavelength. An optical-fiber communication system illustrated in FIG. 31 comprises a Wavelength Division Multiplexing optical transmission portion 801, an optical preamplifier 802, an optical fiber 803, an inline amplifier 804, an optical post-amplifier 805, and a light receiving portion 806. As a light source having a fixed wavelength 807, various kinds of wavelength-variable semiconductor laser devices according to the present invention described above can be used. To be more specific, a plurality of DFB semiconductor laser elements are used as a light source having a fixed wavelength. An emitting wavelength of each channel is ranging from 1532.29 to 1597.19 nm at intervals of 50 GHz; 160 channels in total. Signal light from each channel of the light source is multiplexed into one fiber 810 by a wavelength multiplexer 809 that uses a diffraction grating using a general array waveguide. A means for locally controlling temperature of the semiconductor laser element portion according to the present invention enables adjustment to the emitting wavelength described above.

This example enables us to miniaturize the device and to improve economical efficiency as compared with the conventional configuration. Using this simple configuration, a light-wave signal wavelength of each channel can be set to a desired value, and can be stabilized, by means of an easy artifice. Therefore, it is possible to realize a Wavelength Division Multiplexing communication system with high reliability, and at the same time to produce the effect of increasing a number of channel wavelengths as compared with the conventional system, at a low cost.

As described in detail, using configurations comprising basic elements according to the present invention enables us to exploit the full performance of the etalon. That is to say, according to the present invention, the technical problems are solved, which could not be conventionally overcome from the viewpoints of: resolution of wavelength selection; optical efficiency; improve in density of implementation into a laser light source module; mechanical stability; compensation for a locking-wavelength shift caused by a change in temperature; and the like. Furthermore, if the wavelength control method according to the present invention is utilized, it becomes possible not only to lock a semiconductor-laser's lasing wavelength but also to transfer and lock the wavelength to an arbitrary ITU-TS grid. This method, therefore, provides us with a laser light source that is indispensable for the Wavelength Division Multiplexing optical-fiber communication equipment and a router device for wavelength channels.

The present invention can provide a semiconductor laser light source that is capable of locking an emitting wavelength of the laser light source to a specified value with high accuracy. Naturally, This optical system can be separately operated as a wavelength locker module. However, it can also be built into an optical-fiber communication module comprising the laser light source because of its smaller side.

What is claimed is:

1. Optical-fiber communication equipment, comprising:
   a laser light source,
   a means for changing light of the laser light source to a parallel plane wave to form a parallel light path,
   an etalon having two or more transmission bands and having a free spectral range matched with a channel grid interval of wavelength division multiplexing optical-fiber communication,
   first and second light detecting means, wherein:
   said etalon is located in the parallel light path;
   a wavelength of the laser light source is enabled to be changed so that said wavelength is fixed to a desired value of the channel grid interval of wavelength division multiplexing optical-fiber communication;
   the parallel plane wave is divided into at least two pieces of light including light that is transmitted through said etalon and light passing through a medium and that has optical characteristics different from those of the light that is transmitted through said etalon;
   the first light detecting means detects one divided piece of light and the second light detecting means detects the other divided piece of light;
   signals based on photocurrents from the first and second light detecting means are compared to each other to obtain a signal for setting an emitting wavelength of the laser light source to a desired value; and
   said signal is used for controlling a wavelength of the laser light source,
   wherein said laser source and said etalon are located on the same Peltier cooler so that a temperature of said laser is changed in accordance with a temperature of said etalon, and
   a thickness of said etalon is greater than that of an etalon whose free spectral range is matched with a channel grid interval of wavelength division multiplexing optical-fiber communication without consideration of temperature dependence, so that a shifted quantity of said etalon caused by a temperature of said etalon becomes equal to a difference of a narrowed free spectral range and the channel grid interval, so as to bring the free spectral range of the etalon into match with the channel grid interval.

2. Optical-fiber communication equipment according to claim 1, wherein:
   said etalon is a Fabry Perot type etalon in which:
   a refractive index of its medium is within a range of 1.0 to 4.0;
   surface reflectivities of both reflection planes of the medium are within a range of 20 to 70%; and
   a thickness of the medium is set so that a plurality of light transmission portions are generated at given wavelength intervals, and that any one of the plurality of light transmission portions is equivalent to an emitting wavelength desired by the laser light source.

3. Optical-fiber communication equipment according to claim 1, wherein:
   said etalon is a Fabry Peret type etalon constructed of two or more kinds of materials, which differ from each other in at least one of temperature characteristics and a refractive index.

4. Optical-fiber communication equipment according to claim 1, wherein:
   said laser light source is located at a position that is shifted from an optical axis of the means for changing light of the laser light source to a parallel plane wave to form a parallel light path; or a normal line of an incident end face for said etalon or a laser-light dividing means is located so that the normal line crosses the optical axis of the means for changing light of the laser light source to a parallel plane wave to form a parallel light path.

5. Optical-fiber communication equipment, comprising:
a laser light source,
a means for changing light of the laser light source to a parallel plane wave to form a parallel light path,
an optical system for dividing the parallel plane wave,
an etalon, and
first and second light detecting means, wherein:
said etalon is located in the parallel light path;
said etalon has a plurality of light transmission portions having desired wavelengths existing at given wavelength intervals;
any one of the plurality of light transmission portions corresponds to an emitting wavelength desired for the laser light source;
said optical system for dividing the parallel plane wave divides the parallel plane wave into at least two pieces of light including light that is transmitted through said etalon and light passing through a medium and that has optical characteristics different from those of the light that is transmitted through said etalon;
the first light detecting means detects one divided piece of light and the second light detecting means detects the other divided piece of light;
signals from the first and second light detecting means are compared to each other to obtain a signal for setting an emitting wavelength of the laser light source to a desired value; and
said signal is used for controlling a wavelength of the laser light source so that the wavelength is kept to be a given wavelength,
wherein said laser source and said etalon are located on the same Peltier cooler so that a temperature of said laser is changed in accordance with a temperature of said etalon, and
a thickness of said etalon is greater than that of an etalon whose free spectral range is matched with a channel grid interval of wavelength division multiplexing optical-fiber communication without consideration of temperature dependence, so that a shifted quantity of said etalon caused by a temperature of said etalon becomes equal to a difference of a narrowed free spectral range and the channel grid interval, so as to bring the free spectral range into match with the channel grid interval.

6. Optical-fiber communication equipment according to claim 5, wherein:
said etalon is a Fabry Perot type etalon in which:
a refractive index of its medium is within a range of 1.0 to 4.0;
surface reflectivities of both reflection planes of the medium are within a range of 20 to 70%; and
a thickness of the medium is set so that a plurality of light transmission portions are generated at given wavelength intervals, and so that any one of the plurality of light transmission portions is equivalent to an emitting wavelength desired for the laser light source.

7. Optical-fiber communication equipment according to claim 5, wherein:
said etalon is a Fabry Perot type etalon constructed of two or more kinds of materials, which differ from each other in at least one of temperature characteristics and a refractive index.

8. Optical-fiber communication equipment according to claim 5, wherein:

said optical-fiber communication equipment comprises an information storing portion, and said laser light source comprises a temperature detecting means;
the information storing portion stores temperature characteristics of a light transmission portion of the etalon; and
according to a signal from the temperature detecting means and said stored temperature characteristics of the light transmission portion of the etalon, a shift of an emitting wavelength of the laser light source fmm a channel-grid wavelength of said wavelength division multiplexing optical-fiber communication is compensated.

9. Optical-fiber communication equipment according to claim 5, wherein:
said laser light source is located at a position that is shifted from an optical axis of the means for changing light of the laser light source to a parallel plane wave to form a parallel light path; or a normal line of an incident end face for said etalon or the optical system for dividing the parallel plane wave is located so that the normal line crosses the optical axis of the means for changing light of the laser light source to a parallel plane wave to form a parallel light path.

10. Optical-fiber communication equipment, comprising:
a laser light source,
a means for changing light of the laser light source to a parallel plane wave to form a parallel light path,
an optical system for dividing the parallel plane wave,
an etalon, and
first and second light detecting means, wherein:
said etalon is located in the parallel light path;
said laser light source is capable of lasing at a plurality of lasing wavelengths;
said etalon has a plurality of light transmission portions having desired wavelengths existing at given wavelength intervals;
the wavelength interval of the light transmission portions is equivalent to a channel grid interval of wavelength division multiplexing optical-fiber communication;
any one of said plurality of lasing wavelengths of the laser light source is equivalent to an emitting wavelength corresponding to a desired wavelength that is shifted to a wavelength portion having a highest transmittance among said plurality of light transmission portions provided by the etalon;
said optical system for dividing the parallel plane wave divides the parallel plane wave into at least two pieces of light including light that is transmitted through said etalon and light passing through a medium and that has optical characteristics different from those of the light that is transmitted through said etalon;
signals based on photocurrents from the first and the second light detecting means, which receive each of said divided pieces of light are compared to each other to obtain a signal for setting an emitting wavelength of the laser light source to a desired value; and
said signal is used for controlling each of said plurality of lasing wavelengths provided by the laser light source so that each lasing wavelength is kept to be a given wavelength,
wherein said laser source and said etalon are located on the same Peltier cooler so that a temperature of said laser is changed in accordance with a temperature of said etalon, and
a thickness of said etalon is greater than that of an etalon whose free spectral range is matched with a channel grid interval of wavelength division multiplexing optical-fiber communication without consideration of temperature dependence, so that a shifted quantity of said etalon caused by a temperature of said etalon becomes equal to a difference of a narrowed free spectral range and the channel grid interval, so as to bring the free spectral range of the etalon into match with the channel grid interval.

11. Optical-fiber communication equipment according to claim 10, wherein:
said etalon is a Fabry Perot type etalon in which:
a refractive index of its medium is within a range of 1.0 to 4.0;
surface reflectivities of both reflection planes of the medium are within a range of 20 to 70%; and
a thickness of the medium is set so that a plurality of light transmission portions are generated at given wavelength intervals, and so that any one of the plurality of light transmission portions is equivalent to an emitting wavelength desired for the laser light source.

12. Optical-fiber communication equipment according to claim 10, wherein:
said etalon is a Fabry Perot type etalon constructed of two or more kinds of materials, which differ from each other in at least one of temperature characteristics and a refractive index.

13. Optical-fiber communication equipment according to claim 10, wherein:
said optical-fiber communication equipment comprises an information storing portion, and said laser light source comprises a temperature detecting means;
the information storing portion stores temperature characteristics of a light transmission portion of the etalon; and
according to a signal from the temperature detecting means and said stored temperature characteristics of light transmission portion of the etalon, a shift of an emitting wavelength of the laser light source from a channel-grid wavelength of said wavelength division multiplexing optical-fiber communication is compensated.

14. Optical-fiber communication equipment according to claim 10, wherein:
said laser light source is located at a position that is shifted from an optical axis of the means for changing light of the laser light source to a parallel plane wave to form a parallel light path; or a normal line of an incident end face for said etalon or the optical system for dividing the parallel plane wave is located so that the normal line crosses the optical axis of the means for changing light of the laser light source to a parallel plane wave to form a parallel light path.

15. Optical-fiber communication equipment, comprising:
a laser light source,
a means for changing light of the laser light source to a parallel plane wave to form a parallel light path,
an etalon having two or more transmission bands, and
first and second light detecting means, wherein:
said etalon is located in the parallel light path;
the parallel plane wave is divided into at least two pieces of light including light that is transmitted through said etalon and light passing through a medium and that has optical characteristics different from those of the light that is transmitted through said etalon;
the first light detecting means detects one divided piece of light and the second light detecting means detects the other divided piece of light;

signals based on photocurrents from the first and second light detecting means are compared to each other to obtain a signal representing the free spectral range of the etalon;
said signal representing the free spectral range of the etalon is compared to a wavelength channel grid of plural wavelengths; and
said signal representing the free spectral range is used for controlling a wavelength of the laser light source to match one of the plural wavelengths of the wavelength channel grid,
wherein said laser source and said etalon are located on the same Peltier cooler so that a temperature of said laser is changed in accordance with a temperature of said etalon, and
a thickness of said etalon is greater than that of an etalon whose free spectral range is matched with a channel grid interval of wavelength division multiplexing optical-fiber communication without consideration of temperature dependence, so that a shifted quantity of said etalon caused by a temperature of said etalon becomes equal to a difference of a narrowed free spectral range and the channel grid interval, so as to bring the free spectral range of the etalon into match with the channel grid interval.

16. Optical-fiber communication equipment according to claim 15, wherein:
said optical-fiber communication equipment comprises an information storing portion, and said laser light source comprises a temperature detecting means;
the information storing portion stores temperature characteristics of a light transmission portion of the etalon; and
according to a signal from the temperature detecting means and said stored temperature characteristics of the light transmission portion of the etalon, a shift of an emitting wavelength of the laser light source from the wavelength matched to said one of the plural wavelengths is compensated.

17. Optical-fiber communication equipment according to claim 15, wherein:
said laser light source is located at a position that is shifted from an optical axis of the means for changing light of the laser light source to a parallel plane wave to form a parallel light path; or a normal line of an incident end face for said etalon or a laser-light dividing means is located so that the normal line crosses the optical axis of the means for changing light of the laser light source to a parallel plane wave to form a parallel light path.

18. Optical-fiber communication equipment, comprising:
a laser light source,
a means for changing light of the laser light source to a parallel plane wave to form a parallel light path,
an optical system for dividing the parallel plane wave, an etalon, and
first and second light detecting means, wherein:
said etalon is located in the parallel light path;
said etalon has a plurality of light transmission portions having desired wavelengths existing at given wavelength intervals;
any one of the plurality of light transmission portions corresponds to an emitting wavelength desired for the laser light source;
said optical system for dividing the parallel plane wave divides the parallel plane wave into at least two pieces of light including light that is transmitted through said etalon and light passing through a medium and that has optical characteristics different from those of the light that is transmitted through said etalon;

the first light detecting means detects one divided piece of light and the second light detecting means detects the other divided piece of light;

signals from the first and second light detecting means are compared to each other to obtain a signal representing the free spectral range of the etalon;

said signal representing the free spectral range of the etalon is compared to a wavelength channel grid of plural wavelengths; and said signal representing the free spectral range is used for controlling a wavelength of the laser light source to match one of the plural wavelengths of the wavelength channel grid so that the wavelength is kept to be the matched wavelength, wherein said laser source and said etalon are located on the same Peltier cooler so that a temperature of said laser is changed in accordance with a temperature of said etalon, and a thickness of said etalon is greater than that of an etalon whose free spectral range is matched with a channel grid interval of wavelength division multiplexing optical-fiber communication without consideration of temperature dependence, so that a shifted quantity of said etalon caused by a temperature of said etalon becomes equal to a difference of a narrowed free spectral range and the channel grid interval, so as to bring the free spectral range of the etalon into match with the channel grid interval.

19. Optical-fiber communication equipment according to claim 18, wherein:

said optical-fiber communication equipment comprises an information storing portion, and said laser light source comprises a temperature detecting means;

the information storing portion stores temperature characteristics of a light transmission portion of the etalon; and according to a signal from the temperature detecting means and said stored temperature characteristics of the light transmission portion of the etalon, a shift of an emitting wavelength of the laser light source from the wavelength matched to said one of the plural wavelengths is compensated.

20. Optical-fiber communication equipment according to claim 18, wherein:

said laser light source is located at a position that is shifted from an optical axis of the means for changing light of the laser light source to a parallel plane wave to form a parallel light path; or a normal line of an incident end face for said etalon or the optical system for dividing the parallel plane wave is located so that the normal line crosses the optical axis of the means for changing light of the laser light source to a parallel plane wave to form a parallel light path.

21. Optical-filter communication equipment according to claim 1, wherein a thickness of said etalon is in range of 0.1 mm to 10 mm.

* * * * *